US012625202B2

(12) United States Patent
Musiienko

(10) Patent No.: US 12,625,202 B2
(45) Date of Patent: May 12, 2026

(54) METHOD, COMPUTER PROGRAM, AND SYSTEM FOR DETERMINING RESPECTIVE TRANSPORT PROPERTIES OF MAJORITY AS WELL AS MINORITY CHARGE CARRIERS IN A SAMPLE

(71) Applicant: Helmholtz-Zentrum Berlin für Materialien und Energie Gmbh, Berlin (DE)

(72) Inventor: Artem Musiienko, Berlin (DE)

(73) Assignee: Helmholtz-Zentrum Berlin für Materialien und Energie GmbH, Berlin (DE)

( * ) Notice: Subject to any disclaimer, the term of this patent is extended or adjusted under 35 U.S.C. 154(b) by 184 days.

(21) Appl. No.: 18/659,036

(22) Filed: May 9, 2024

(65) Prior Publication Data

US 2024/0385262 A1 Nov. 21, 2024

(30) Foreign Application Priority Data

May 16, 2023 (EP) .................................... 23173681

(51) Int. Cl.
*G01R 33/07* (2006.01)
*G01R 31/26* (2020.01)
*G01R 33/00* (2006.01)
*G01R 33/12* (2006.01)

(52) U.S. Cl.
CPC ....... *G01R 33/072* (2013.01); *G01R 31/2642* (2013.01); *G01R 33/0064* (2013.01); *G01R 33/1253* (2013.01)

(58) Field of Classification Search
CPC ............ G01R 31/2642; G01R 33/1253; G01R 33/072; G01R 33/0064; G01R 31/2648; H01L 22/14
See application file for complete search history.

(56) References Cited

U.S. PATENT DOCUMENTS

| | | | |
|---|---|---|---|
| 11,585,871 B1 | 2/2023 | Gunawan | |
| 2018/0095147 A1* | 4/2018 | Gunawan ............... G01R 33/12 |

(Continued)

OTHER PUBLICATIONS

Gunawan Oki et al: "Carrier-resolved photo-Hall effect", CLEO: Application and Technology 2019, San Jose, California, United States, May 5-10, 2019, Optica, vol. 575, No. 7781, Oct. 7, 2019 (Oct. 7, 2019), pp. 151-155.

(Continued)

*Primary Examiner* — Eman A Alkafawi
*Assistant Examiner* — Suresh K Rajaputra
(74) *Attorney, Agent, or Firm* — JMB Davis Ben-David

(57) ABSTRACT

The invention relates to method for determining respective transport properties of majority as well as minority charge carriers in a sample (107) comprising the majority and the minority charge carriers that correspond to electrons and holes or vice versa. The method particularly allows to determine the charge carrier density of the majority charge carriers and the charge carrier density of the minority charge carriers. For the method, a plurality of Hall measurement trials is performed on the sample (107), wherein during each Hall measurement trial, the sample (107) is exposed to an illumination intensity I, wherein a Hall coefficient and a conductivity are acquired from each Hall measurement trial, wherein in a first Hall measurement trial, the sample (107) is exposed to a first illumination intensity $I_1$, in the range of zero to 0.02 suns, particularly wherein the first illumination intensity is zero, and a first Hall coefficient $R_H(I_1)$ and a first conductivity $\sigma(I_1)$ are acquired, wherein from the first Hall coefficient and the first conductivity, a carrier mobility $\mu_1$ is determined, wherein in a second measurement trial, the sample (107) is exposed to a second illumination intensity $I_2$ and a second Hall coefficient $R_H(I_2)$ and a second conductivity $\sigma(I_2)$ are acquired, wherein from the second Hall (Continued)

coefficient and the second conductivity, a second carrier mobility $\mu_2$ is determined, wherein the second illumination intensity $I_2$ is so high that a charge carrier density of electrons and a charge carrier density of holes in the sample (107) are identical, that the second Hall coefficient asymptotically approaches zero and that a second Hall mobility obtained from the product of the second Hall coefficient and the second conductivity asymptotically approaches a constant value, wherein a third carrier mobility $\mu_3$ is determined from the first and the second carrier mobility, particularly by subtracting the second carrier mobility from the first carrier mobility if the Hall coefficient has the same sign for the first and the second illumination intensity or by adding the second carrier mobility to the first carrier mobility if the Hall coefficient changes its sign for the first and the second illumination intensity, wherein the first carrier mobility $\mu_1$ is assigned to, particularly corresponds to a mobility of the majority charge carriers, $\mu_2$ is assigned to, particularly corresponds the absolute value of the difference between hole and electron mobility, and the third carrier mobility $\mu_3$ is assigned to, particularly corresponds to a mobility of the minority charge carriers in the sample (107). The invention also relates to a computer program and a system for determining respective transport properties of majority as well as minority charge carriers in a sample (107).

15 Claims, 11 Drawing Sheets

(56) References Cited

U.S. PATENT DOCUMENTS

| | | | | |
|---|---|---|---|---|
| 2020/0326306 | A1* | 10/2020 | Gunawan | ............... G01N 27/72 |
| 2021/0262982 | A1 | 8/2021 | Gunawan | |

OTHER PUBLICATIONS

Chen Y. et al: "Extended carrier lifetimes and diffusion in hybrid perovskites revealed by Hall effect and photoconductivity measurements", Nature Communications, vol. 7, No. 1, Aug. 1, 2016 (Aug. 1, 2016), pp. 1-9.
Musiienko Artem et al: "Defects in Hybrid Perovskites: The Secret of Efficient Charge Transport", Advanced Functional Materials, vol. 31, No. 48, Sep. 1, 2021 (Sep. 1, 2021), pp. 1-13.

* cited by examiner

Figure 5:
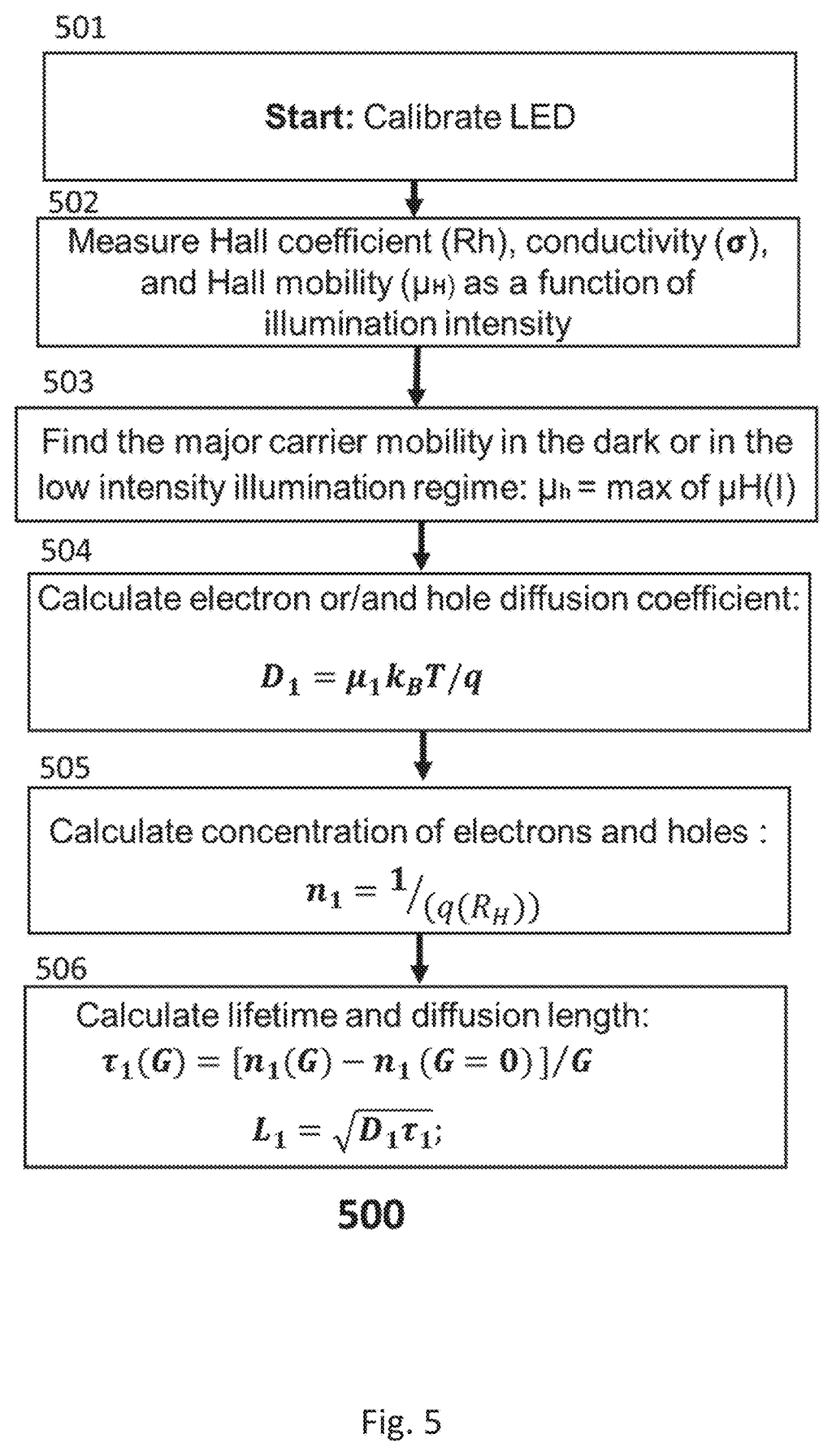

501

| Start: Calibrate LED |
|---|

502

| Measure Hall coefficient (Rh), conductivity ($\sigma$), and Hall mobility ($\mu_H$) as a function of illumination intensity |
|---|

503

| Find the major carrier mobility in the dark or in the low intensity illumination regime: $\mu_h$ = max of $\mu H(I)$ |
|---|

504

Calculate electron or/and hole diffusion coefficient:

$$D_1 = \mu_1 k_B T / q$$

505

Calculate concentration of electrons and holes :

$$n_1 = {}^1\!/_{(q(R_H))}$$

506

Calculate lifetime and diffusion length:

$$\tau_1(G) = [n_1(G) - n_1(G = 0)]/G$$

$$L_1 = \sqrt{D_1 \tau_1};$$

Start: use previously measured conductivity ($\sigma$), Hall coef. $R_H$, and Hall mobility ($\mu_H$) as a function of intensity(I)

902

Find the major carrier mobility – maximum mobility

$$\mu_{1,corr} = max(\mu_H(I))$$

903

Calculate parasitic conductivity ($\sigma_S$) , dark concentration as:

$$n_{1,corr}(I = 0) = \mu_H(I_1)\sigma/\left(q\left(max(\mu_H(I))\right)^2\right) \quad \sigma_s = \sigma(I_1) - q\mu_{1,corr}n_{1,corr}(I_1)$$

904

Calculate difference between hole and electron mobility using neighbor points (or) any two intensity points (D and C):

$$\mu_1 - \mu_3 = \mu_2 = \left|\frac{\left(\mu_H(I_D)\sigma_D(I_D) - \mu_H(I_C)\sigma_C(I_C)\right)}{\left(\sigma_D(I_D) - \sigma_C(I_C)\right)}\right|$$

905

Finish: Go back to main calculation Algorithm and concentration calculation

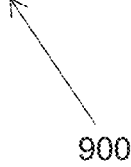

Start: use previously measured conductivity ($\sigma$) , Hall mobility $\mu_H$ as a function of intensity(I), values of major and minor  mobility  ($\mu_1$) and hole mobility ($\mu_3$)

1002

Find concentration :

$$\Delta n_3 = \Delta n_1 = \sigma/\big(q(\mu_1 + \mu_3)\big)$$

1003

Finish: Go back to main calculation Algorithm and charge transport parameters calculation

1000

METHOD, COMPUTER PROGRAM, AND SYSTEM FOR DETERMINING RESPECTIVE TRANSPORT PROPERTIES OF MAJORITY AS WELL AS MINORITY CHARGE CARRIERS IN A SAMPLE

CROSS-REFERENCE TO RELATED APPLICATIONS

This application claims the right of priority of European Patent Application No. EP 23173681.0, filed May 16, 2023, the contents of which are incorporated by reference herein in its entirety.

FIELD

The present invention concerns a method, a computer program as well as a system for determining respective transport properties of majority as well as minority charge carriers in a sample.

BACKGROUND OF THE INVENTION

The development of novel and improvement of existing semiconductor and semi-insulating materials relies on the precise knowledge of free-charge transport properties. In particular, knowledge of minority and majority charge carrier diffusion lengths, lifetimes, mobilities, and carrier densities allows for tailoring the design of semiconductor devices and control effectiveness of solar cells, transistors, detectors, sensors, and LEDs. At the moment, the detection of minority and majority charge properties, i.e. of electrons and holes or vice versa, is challenging due to the limitation of the experimental methods. The methods, such as time-resolved photoluminescence (trPL), can detect a lifetime for only a minority of carriers, which control the fast decay component of the signal. The additional drawback of the commonly used methods is that they probe charge carriers' properties in a transient regime which is not matched with device or material operation conditions in a steady state. Therefore, there is a demand for probing the charge carrier properties, that include separate holes and electron carrier densities, lifetimes, diffusion length, and mobility, particularly under steady state conditions, in order to characterize semiconductor materials and -devices.

The Hall effect, which is a reaction of the material on the magnetic field, was discovered by Edwin Hall in 1879. The Hall effect voltage is proportional to the strength of the magnetic field and the applied electrical current. Hall described the reaction of gold films on the magnetic field and considered only one carrier type—the electron. In the twentieth century, it was demonstrated that a combination of light and the Hall effect could be used to access electron and hole signals in semiconductors due to the unique feature of the Hall effect signal consisting of contributions of both holes and electrons. On the other hand, this approach had limiting implications due to the unknown value of electron and hole mobility which have not allowed resolute carrier transport parameters. Recently, several studies used a single carrier regime assuming an equal charge carrier density of holes and electrons to assess the properties of carriers in general. Methods for measurements of photogenerated charge carriers by the Hall method were presented (U.S. Pat. No. 10,197,640 B2, US2021262982A1), wherein the charge carrier density of holes and electrons and their lifetimes were assumed to be equal for any light intensity. However, particularly in semiconductors, the carrier densities, lifetimes, and diffusion lengths of electrons and holes are not equal due to the presence of traps. Assuming the same charge carrier density of holes and electrons therefore leads to incorrect charge transport description.

SUMMARY OF THE INVENTION

Based on this, it is subject of the present invention to provide a method, a computer program as well as a system that allows reliable determination of transport properties of majority as well as minority charge carriers, respectively.

This task is solved by a method for determining respective transport properties of majority as well as minority charge carriers with the features of claim 1 as well as a corresponding computer program with the features of claim 14 and a corresponding system with the features of claim 15.

BRIEF DESCRIPTION OF THE DRAWINGS

In the following, examples of the present invention and its preferred embodiments are described with reference to the accompanying drawings.

FIG. 5 shows a flowchart of another embodiment of the method and the computer program according to the first and the second aspect of the invention;

FIG. 6 shows a flowchart of a correction algorithm used to determine respective corrected values of the majority charge carrier mobility, the majority charge carrier density, and minority charge carrier mobility in case of parasitic conductivity and/or for low signal to noise ratio;

DETAILED DESCRIPTION OF THE INVENTION

Figure 1:
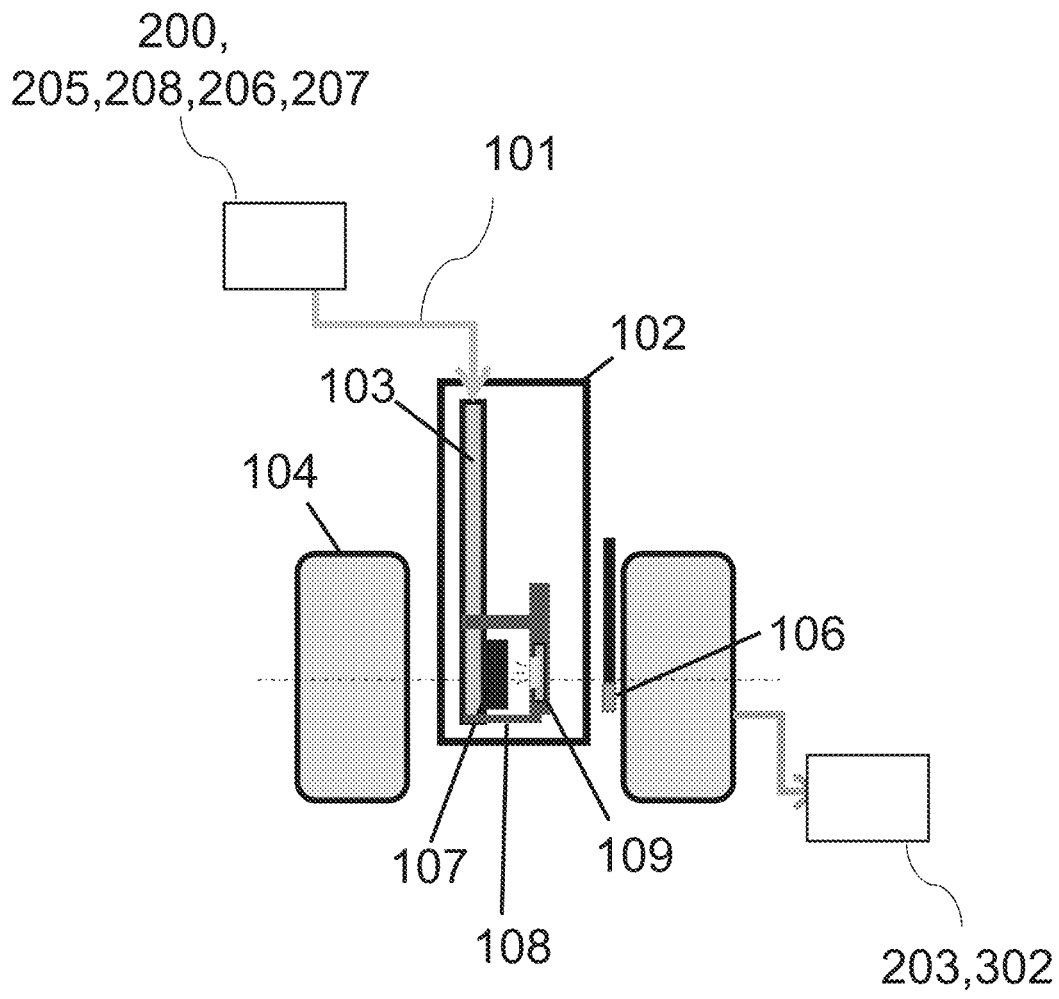
FIG. 1 shows a schematic overview of an embodiment of the system according to the third aspect of the invention.

Advantageous embodiments of the invention are given in the corresponding dependent claims and described in the following.

The first aspect of the invention relates to a method for determining respective transport properties of majority as well as minority charge carriers in a sample comprising the majority and the minority charge carriers that correspond to electrons and holes or vice versa. In the method according to the first aspect of the invention, a plurality of Hall measurement trials is performed on the sample, wherein during each Hall measurement trial, the sample is exposed to an illumination intensity I, and a Hall coefficient and a conductivity are acquired from each Hall measurement trial.

In or during a first Hall measurement trial of the plurality of Hall measurement trials, the sample is exposed to a first illumination intensity $I_1$, in the range of zero to 0.02 suns, particularly wherein the first illumination intensity is zero, and a first Hall coefficient $R_H(I_1)$ and a first conductivity $\sigma(I_1)$ are acquired, wherein from the first Hall coefficient and the first conductivity, a first carrier mobility $\mu_1$ is determined.

In or during a second measurement trial of the plurality of Hall measurement trials, the sample is exposed to a second illumination intensity $I_2$ and a second Hall coefficient $R_H(I_2)$ and, a second conductivity $\sigma(I_2)$ are acquired, wherein from the second Hall coefficient and the second conductivity, a second carrier mobility $\mu_2$ is determined, wherein the second illumination intensity $I_2$ is so high that a charge carrier density of electrons and a charge carrier density of holes in the sample are identical and that the second Hall coefficient asymptotically approaches zero at the second illumination intensity $I_2$ and that a second Hall mobility obtained from the product of the second Hall coefficient and the second conductivity asymptotically approaches a constant value.

A third carrier mobility $\mu_3$ is determined from the first and the second carrier mobility, particularly by subtracting the second carrier mobility from the first carrier mobility if the Hall coefficient has the same sign for the first and the second illumination intensity or by adding the second carrier mobility to the first carrier mobility if the Hall coefficient changes its sign for the first and the second illumination intensity.

The first carrier mobility $\mu_1$ is assigned to, particularly corresponds to a mobility of the majority charge carriers, $\mu_2$ is assigned to, particularly corresponds to the absolute value of the difference between hole and electron mobility, and the third carrier mobility $\mu_3$ is assigned to, particularly corresponds to a mobility of the minority charge carriers in the sample.

Generally, the sample, particularly a semiconductor, comprises majority as well as minority charge carriers by means of electrons and holes or vice versa. However, their contribution to conduction depends strongly on the illumination intensity to which the charge carriers are exposed. Particularly, for low illuminations $I_1$, particularly at zero illumination, the contribution of the majority charge carriers may be so large that the influence of the minority charge carriers on conduction is negligible. As the illumination intensity is increased from $I_1$, the contribution of the minority charge carriers to conduction increases towards a regime around $I_2$, where the charge carrier density of majority and minority charge carriers are essentially identical.

Particularly, the first illumination intensity is zero.

The term "identical" preferably comprises deviations between the charge carrier densities of the majority and minority charge carriers within the range of 0.01% to 15%, which arise as a consequence of the large charge carrier densities, that are typically between $10^{13}$ to $10^{17}$ cm$^{-3}$ for illuminations between 0.02 sun and 10 sun.

The respective charge carrier densities of the majority or minority charge carriers include a respective dark charge carrier density at the first illumination, particularly at zero illumination intensity as well as a respective photogenerated charge carrier density due to photogenerated charge carriers at the second illumination intensity.

Experimentally, converging, particularly identical charge carrier densities generally show by means of at least a partial cancellation of the contributions of the majority and the minority charge carriers to the Hall coefficient, such that the Hall coefficient asymptotically approaches zero as the illumination is increased into the regime around $I_2$. The Hall coefficient asymptotically approaching zero is thus one of the signatures for identical charge carrier densities. The term "asymptotically" means that increasing the illumination intensity from one illumination intensity value in predefined increments to higher illumination intensity values goes along with smaller changes in the absolute value of the Hall coefficient for every consecutive increment within the accuracy of the measurement.

Particularly, from the acquired conductivity and the Hall coefficient, particularly wherein the Hall coefficient is obtained from $R_H = V_H d/(I_0 B)$ with $I_0$ the applied electrical current, B the magnetic field amplitude, d the thickness of the sample; a Hall mobility may be determined for a given illumination intensity, $\mu_H(I) = \sigma(I)R_H(I)$, particularly for $I = I_1$ or $I_2$.

Particularly, for increasing illumination intensities, the conductivity increases, while the Hall coefficient shows an asymptotical approach towards zero. The second Hall mobility, that is, the Hall mobility at the second illumination intensity, may be obtained from the product of the conductivity and the Hall coefficient at the second illumination intensity. At $I_2$, the increase of the conductivity and the asymptotical approach towards zero of the Hall coefficient result in an asymptotical approach of the Hall mobility toward a constant value. Particularly, $I_2$ is so high that the Hall mobility shows an asymptotical approach by means of a saturation-like rise, towards a constant value for $I_2$, for example for Si-based samples. For other samples, for example, Perovskite-based samples, the Hall mobility shows an asymptotical approach by means of a depletion-like drop towards a constant value for $I_2$. The Hall mobility shows an asymptotical approach towards a constant value for $I_2$ is thus the second signature for identical charge carrier densities.

Particularly, $I_2$ is higher than 0.02 suns, more particularly higher than 0.1 suns.

In the case of a sample with one of the two carrier types having a significantly larger mobility than the other one, for example p-type doped Silicon with much larger electron mobility compared to the hole electron mobility, identical charge carrier densities of the majority and the minority charge carriers leads to a saturation of the Hall mobility in the regime of $I_2$, accompanying the asymptotical approach to zero of the Hall coefficient. Hence, the second illumination intensity $I_2$ may be chosen so high that for $I_2$, i) the second Hall coefficient asymptotically approaches zero and ii) the Hall mobility approaches a constant value, within deviations of less than 10% compared to the constant value. Due to the much larger mobility of electrons, the Hall coefficient first drops steeply as the illumination is increased from $I_1$ and changes its sign from positive to negative. If the illumination is further increased towards $I_2$, the Hall coefficient features the characteristic asymptotical approach, particularly decreasing towards zero. As such, the steep drop of the Hall coefficient in the illumination regime where the sign is changed is not to be confused with the smooth, asymptotic approach towards zero, such that $I_2$ may be selected from this illumination regime.

In the case of a sample with one of the two carrier types having a similar mobility compared to the other one, for example a p-type halide perovskite semiconductor with similar electron and hole mobility, identical charge carrier densities of electrons and holes show by means of a monotonic, asymptotic decrease of the Hall coefficient to zero or below the lower sensitivity limit of the lock-in amplifier and source meter, where electrons and holes completely compensate each other, allowing to select a value for $I_2$ from this regime. Particularly, for perovskite, the Hall coefficient takes on only one sign between the first and the second illumination intensity.

The sample may comprise an essentially planar structure, particularly a semiconductor structure, that can be grown epitaxially, and/or spin coated, and/or air blade coated, and/or dip coated, and/or inkjet printed, and/or vapor deposited, and/or ultrasonic sprayed and/or comprise features manufactured lithographically. These kinds of samples typically comprise small vertical dimensions, herein also referred to as a thickness d, compared to their lateral dimensions, herein also referred to as the width and length of the sample. Consequently, the sample may comprise two main surfaces extending along the lateral dimensions of the sample.

The Hall measurement trial is preferably understood as a Hall measurement, wherein a current, particularly a constant current, is applied between two contacts on the sample and wherein a magnetic field is applied particularly perpendicular to the current. In particular, the magnetic field is applied perpendicular to the main surfaces of the sample. The sample may comprise at least four, particularly exactly four or exactly six electrical contacts, particularly Ohmic contacts, for performing electrical measurements on the sample. To this end, the sample may comprise conductive regions in the shape of a Hall bar with the contacts arranged in peripheral arms of the Hall bar or four-point probe placed around the perimeter of the sample. The Hall voltage for acquiring the Hall coefficient is preferably determined by acquiring the electrical voltage between two contacts arranged perpendicular to the current flow and the magnetic field, which is caused by charge carriers that are deflected by the Lorentz force. The ratio between the Hall voltage and the applied current defines a Hall coefficient, $R_H = V_H d/(I_0 B)$. Moreover, during the Hall measurement trial, a longitudinal voltage $V_{xx}$ between two contacts arranged along the direction of the current is acquired. From the current, the sample thickness and the longitudinal voltage, a conductivity is determined from $\sigma = I_0/(V_{xx} d)$. In the case of the 4-probe sample, $\sigma$ is multiplied by coefficient 0.2207.

Particularly, the mobility of the majority charge carriers is acquired from the Hall mobility at the first illumination intensity, $\mu_H(I_1) = \sigma(I_1) R_H(I_1) = \mu_1$. This is because at the first illumination intensity, particularly for zero illumination, the contribution of the majority charge carriers to conduction dominates the acquired measurement signals by means of the conductivity and the Hall coefficient.

To determine the mobility of the minority charge carriers buried in the measurement signals comprising the Hall coefficient and the conductivity, the second mobility is preferably determined from $\mu_H(I_2) = \sigma(I_2) R_H(I_2) = \mu_2$.

From the first and the second mobility, the mobility of the minority charge carriers, also denoted herein as the third mobility, can be determined.

In the case of a sample with minority charge carriers having a larger mobility compared to the majority charge carriers, like for example in p-type Silicon, the third mobility is determined from adding the first and the second mobility, $\mu_3 = \mu_1 + \mu_2$.

In the case of a sample with majority carriers having a larger mobility compared to the minority charge carriers, like, for example, in p-type halide perovskite, the third mobility is determined by subtracting the second mobility from the first mobility, $\mu_3 = \mu_1 - \mu_2$.

According to an embodiment of the first aspect of the invention, if $R_H(I_1) > 0$, the majority charge carriers are holes and the minority charge carriers are electrons and wherein if $R_H(I_1) < 0$, the majority charge carriers are electrons and the minority charge carriers are holes. As such, the majority and the minority charge carrier can be immediately determined from the sign of $R_H(I_1)$.

The comparison of the majority and the minority charge carrier mobilities ($\mu_1$ and $\mu_3$) can be initially challenging due to unknown $\mu_3$. To resolve this issue, the sign of the Hall coefficient $R_H(I)$ is preferably considered between $I_1$ and $I_2$. If between $I_1$ and $I_2$, the sign of $R_H(I)$ changes (from – to + or from + to –), then the minority charge carriers have larger mobility compared to the majority charge carriers, as for example in the case of p-type Silicon. If the sign of $R_H(I)$ does not change between $I_1$ and $I_2$, then the majority carriers have larger mobility compared to the minority charge carriers, as for example in the case of p-type perovskite.

In an embodiment of the first aspect of the invention, one or more intermediate Hall measurement trials are executed, wherein for each of the intermediate measurement trials the sample is exposed to a differing illumination intensity, wherein the illumination intensity of each intermediate measurement trial lies between the first illumination intensity $I_1$ and the second illumination intensity $I_2$, wherein an intermediate Hall coefficient and an intermediate conductivity are determined for each intermediate measurement trial, particularly wherein the Hall coefficient $R_H$ and the conductivity $\sigma$ is determined as a function of the illumination intensities I from the plurality of Hall measurement trials.

Further Hall measurement trials can be performed for intensities larger than $I_2$ to study charge transport properties at higher intensities.

Particularly, one or more intermediate Hall measurement trials are comprised of the plurality of Hall measurement trials.

Preferably, for each of the one or more intermediate Hall measurement trials, the sample is exposed to a different illumination intensity. For example, starting from the first illumination intensity, the illumination intensity may be increased up to the second illumination intensity, wherein intermediate Hall measurements are performed for discrete illumination intensities in the range between $I_1$ and $I_2$. For example, intermediate Hall measurements may be performed at between 5 to 100 or between 100 to 1000 illumination intensities between $I_1$ and $I_2$. As such, the Hall coefficient and the conductivity $\sigma$ may be obtained as a function of the illumination intensity, $V_H(I)$ and $\sigma(I)$, in the range set by $I_1$ and $I_2$.

According to another embodiment of the first aspect of the invention, a minority charge carrier density $n_3$ is determined, particularly as a function of the illumination intensity I, from the conductivity $\sigma(I)$, a Hall coefficient Ry as well as the first and the third mobility $\mu_1$, $\mu_3$, particularly from $$n_3 = \frac{\sigma(\mu_1 - R_H\sigma)}{(q(\mu_1\mu_3 + \mu_3\mu_3))}$$

if holes are the majority charge carriers, so that $n_3$ represents the charge carrier density of the minority charge carriers, that is, electrons, and from $$n_3 = \frac{\sigma(\mu_3 + R_H\sigma)}{(q(\mu_1\mu_3 + \mu_1\mu_1))}$$

if electrons are the majority charge carriers, so that $n_3$ represents here the charge carrier density of the minority charge carriers, that is, holes, with q being the elementary charge.

In yet another embodiment of the first aspect of the invention, a majority charge carrier density $n_1$ is determined, particularly as a function of the illumination intensity I, from the conductivity $\sigma$, the minority charge carrier density $n_3$, as well as the first and the third mobility $\mu_{1,3}$, particularly from $$n_1 = \left(\frac{\sigma}{q} - n_3\mu_3\right)/\mu_1.$$

According to another embodiment of the first aspect of the invention, at least one of the following transport properties is determined as follows, particularly as a function of the illumination intensity I:

a majority and/or a minority charge carrier lifetime $\tau_{1,3}$ based on the majority charge carrier density $n_1$ and/or the minority charge carrier density $n_3$ well as a generation rate G due to the absorption of photons, particularly from $\tau_{1,3}(G)=[n_{1,3}(G)-n_{1,3}(G=0)]/G$, with the generation rate $G=I\lambda10^{-9}/(hc10^3d)$, and $\lambda$ the wavelength of electromagnetic radiation providing the illumination, h Planck constant, c speed of light, and d a thickness of the sample;

a majority and/or a minority charge carrier diffusion coefficient $D_{1,3}$ from the majority charge carrier mobility $\mu_1$ and/or the minority charge carrier mobility $\mu_3$ as well as a temperature T of the sample, particularly from $D_{1,3}=\mu_{1,3}k_BT/q$;

a majority and/or a minority charge carrier diffusion length $L_{1,3}$ based on the majority and/or the minority charge carrier lifetime $\tau_{1,3}$ as well as the majority and/or the minority charge carrier diffusion coefficient $D_{1,3}$, particularly from $L_{1,3}=\sqrt{D_{1,3}\tau_{1,3}}$;

a Quasi-Fermi level splitting $QFLS_{1,3}$ of major and minor carriers, based on the sample temperature T as well as the majority and the minority charge carrier density $n_{1,3}$, particularly from $QFLS_{1,3}=k_BT\ \ln(n_{1,3}/n_{int})/q$, a total Quasi-Fermi level splitting $QFLS_{total}$ based on the sample temperature T, the majority and the minority charge carrier density $n_{1,3}$, particularly from $QFLS_{total}=k_BT\quad\ln(n_1n_3/n_{int}^2)/q\quad$ where $\quad n_{int}=\sqrt{n_1(G=0)n_3(G=0)}$ is an intrinsic carrier density, and an ideality factor $$\eta = \frac{q(QFLS_B - QFLS_A)}{\ln(G_B/G_A)k_bT},$$

wherein $QFLS_{B,A}$ are total Quasi Fermi level splitting determined at two different generation rates $G_{A,B}$, respectively, particularly wherein the two generation rates $G_{A,B}$ differ from each other by at least 25% and $G_B>G_A$.

In an embodiment of the first aspect of the invention, if the Hall coefficient $R_H(I)$ and the conductivity $\sigma(I)$ are altered by a parasitic conductivity $\sigma_s$, such that an acquired Hall mobility $\mu_H(I)=R_H(I)\sigma(I)$ comprises a peak value $\max(\mu_H(I))$ with $\max(\mu_H(I))>\mu_H(0)$, particularly with $\max(\mu_H(I))>\mu_1$, a corrected majority charge carrier density at the first illumination intensity, particularly at zero intensity, $n_{1,corr}(I=0)$ accounting for parasitic contributions $\sigma_s$ to the first conductivity $\sigma(I_1)$ is determined based on the first conductivity $\sigma(I_1)$ and $\mu_H(I)$, particularly from $n_{1,corr}(I=0)=\mu_H(I_1)\sigma/(q(\max(\mu_H(I)))^2)$, and/or wherein a corrected first mobility $\mu_{1,corr}$ is determined based on $\mu_H(I)$, particularly from $\mu_{1,corr}=\max(\mu_H(I))$.

Generally, parasitic conductivity shows by means of a peak of the measured Hall mobility as a function of the illumination intensity $\mu_H(I)$. For example, in the case of Perovskite, the Hall mobility typically comprises a single peak between $I_1$ and $I_2$, such that the peak value in this example can be particularly found from $\max(\mu_H(I))$.

However, samples may also exhibit a hybrid behavior between Silicon and Perovskite, which may cause a plurality, particularly two peaks between $I_1$ and $I_2$. In this case, the parasitic conductivity is preferably determined from the first peak value of $\mu_H(I)$ as the intensity is increased from $I_1$.

Particularly, the peak value can be determined or identified from considering the derivative of the Hall mobility as a function of the illumination intensity. In particular, the peak value can be determined or identified by searching the point where the derivative of the Hall mobility is at or around a minimum, particularly at or around zero.

According to another embodiment of the first aspect of the invention, the parasitic conductivity $\sigma_s$ is determined based on the first conductivity $\sigma(I_1)$, the corrected first mobility $\mu_{1,corr}$ and the corrected majority charge carrier density $n_{1,corr}(I_1)$, particularly from $\sigma_s=\sigma(I_1)-q\mu_{1,corr}n_{1,corr}(I_1)$.

In yet another embodiment of the first aspect of the invention, if the determined $\mu_1$ and $\mu_3$ differ from each other by less than 15%, and/or the acquired Hall coefficient $R_H(I)$ and the acquired conductivity $\sigma(I)$ are affected by parasitic conductivity and/or the acquired Hall coefficient $R_H(I)$ comprises a low signal-to-noise ratio of less than 1, $\mu_2$ is determined based on respective Hall mobilities $\mu_H(I_C)$ and $\mu_H(I_D)$, and conductivities $\sigma(I_C)$ and $\sigma(I_D)$ acquired at two different illumination intensities $I_C$ and $I_D$ between $I_1$ and $I_2$, respectively, wherein $I_D$ exceeds $I_C$ by at least 25%, and $I_D>I_C$, particularly from $$\mu_2 = \left|(\mu_H(I_D)\sigma(I_D) - \mu_H(I_C)\sigma(I_C))/(\sigma(I_D) - \sigma(I_C))\right| = |\beta|.$$

Particularly, $\mu_3$ is determined by adding the first and the second charge carrier mobility if $\beta<0$ and $(\mu_H(I_D)<\mu_H(I_C))$, or if $\beta>0$ and $\mu_H(I_D)>\mu_H(I_C)$ and $\mu_3$ is determined by subtracting the second charge carrier mobility from the first charge carrier mobility, if $\beta>0$ and $\mu_H(I_D)<\mu_H(I_C)$.

According to an embodiment of the first aspect of the invention, if the acquired Hall coefficient $R_H(I)$ comprises a signal-to-noise ratio of less than 1 and if the majority and the minority charge carriers are both photogenerated by the same amount, $\Delta n_1(\Delta I)=\Delta n_3(\Delta I)$, such that their respective photogenerated charge carrier densities are equal and determined based on $\sigma$ and $\sigma(I=0)$ as well as $\mu_1$ and $\mu_3$, particularly from $$\Delta n_1(I) = \Delta n_3(I) = (\sigma(I) - \sigma(I = 0))/(q(\mu_1 + \mu_3)).$$

In another embodiment of the first aspect of the invention, if the acquired Hall coefficient $R_H(I)$ comprises a signal-to-noise ratio of less than 1 and if only the majority charge carriers are photogenerated, such that only $n_1$ (and not $n_3$) changes as a function of the illumination intensity, $n_1$ is determined based on $\sigma(I)$ and $\mu_1$, particularly from $$n_1 = \sigma(I)/(q(\mu_1)).$$

The formulation "that only $n_1$ changes as a function of the illumination intensity" is preferably understood such that $n_1$ does change as a function of the illumination intensity and $n_3$ does not.

According to another embodiment of the first aspect of the invention, the illumination is provided by means of a continuous electromagnetic wave, particularly using a light emitting diode (LED) or a laser diode (LD).

In yet another embodiment of the first aspect of the invention, the sample is comprised by a semiconductor device or a component of the semiconductor device, such as a solar cell, an interface, a transistor, a photodetector and/or a diode, wherein the respective transport properties of the sample majority as well as minority charge carriers of the sample comprised by the semiconductor device are characterized.

A second aspect of the invention relates to a computer program comprising instructions which, when the program is executed by a computer, cause the computer to carry out the method according to the first aspect of the invention.

A third aspect of the invention relates to a system for determining respective transport properties of majority and minority charge carriers in a sample comprising the majority and the minority charge carriers that correspond to electrons and holes or vice versa. The system is configured to determine the respective transport properties using the method according to the first aspect of the invention and/or using the computer program according to the second aspect of the invention.

According to the third aspect of the invention, the system comprises:

a magnet configured to expose the sample to a magnetic field, a current source configured to apply an electrical current through the sample, a source of electromagnetic radiation configured to expose the sample to electromagnetic radiation with different illumination intensities, a measurement unit configured to acquire a Hall coefficient and a conductivity both at a first illumination intensity $I_1$ in the range of zero to 0.02 suns, particularly at zero illumination, as well as at a second illumination intensity $I_2$ that is so high that a charge carrier density of electrons and a charge carrier density of holes in the sample are identical and that the second Hall coefficient asymptotically approaches zero at the second illumination intensity $I_2$ and that a second Hall mobility obtained from the product of the second Hall coefficient and the second conductivity asymptotically approaches a constant value, and a processing unit, particularly wherein the processing unit is part of said computer, wherein the processing unit is configured to determine:

a first mobility $\mu_1$ acquired at the first illumination intensity as well as a second mobility $\mu_2$ acquired at the second illumination intensity, and a third mobility $\mu_3$ from the first and the second mobility, particularly by subtracting the second mobility from the first mobility if the Hall coefficient has the same sign for the first and the second illumination intensity or by adding the second mobility with the first mobility if the Hall coefficient changes its sign for the first and the second illumination intensity, wherein the first mobility $\mu_1$ corresponds to a mobility of the majority charge carriers $\mu_2$ corresponds to the absolute value of the difference between hole and electron mobility, and the third mobility $\mu_3$ corresponds to a mobility of the minority charge carriers in the sample.

Particularly, the embodiments of the first aspect of the invention apply to the second and/or the third aspect of the invention.

EXEMPLARY EMBODIMENTS

Exemplary embodiments are described below in conjunction with the Figures. The Figures are appended to the claims and are accompanied by text explaining individual features of the shown embodiments and aspects of the present invention. Each individual feature shown in the Figures and/or mentioned in the text of the Figures may be incorporated (also in an isolated fashion) into a claim relating to the method, the computer program and/or the system according to the first, second and the third aspect of the present invention.

FIG. 1 shows a system 100 for determining respective transport properties of majority and minority charge carriers in a sample 107, according to an embodiment of the third aspect of the invention. The system 100 is designed to probe the sample 107 in order to determine respective transport properties of majority and minority charge carriers in the sample 107. Particularly, the sample 107 comprises semiconducting, semi-insulating, and/or insulation materials. The system 100 of the present embodiment comprises a cryostat 102 for cooling down the sample from room temperature to cryogenic temperatures, particularly to a temperature down to a few milli Kelvin (mK). As such, the transport properties of the majority and the minority charge carriers may not only be accessed as a function of the illumination intensity, but additionally as a function of the temperature T of the sample. The system 100 of the present embodiment comprises a measurement unit 200 comprising a first current source 205, a second current source 208, a current meter 206, and a source meter 207. By means of the first current source 205, an electrical current is applied through two electrical contacts, particularly Ohmic contacts, of the sample. The source meter 207 is used to acquire a Hall voltage $V_H$ between two contacts that are arranged perpendicular to the current flow as well as a longitudinal voltage $V_{xx}$ between two contacts arranged along the direction of the current. The sample 107 may for example comprise four or six contacts, particularly wherein the contacts are arranged in a Hall-bar-scheme or in four-point probe placed around the perimeter of the sample on the sample 107. The source meter 207 as well as the first current source 205 are connected to the sample 107 and a Hall effect insert card 103 by electrical connections line 101. A Hall effect insert card 103 supports the sample 107 as well as a source of electromagnetic radiation 109 by means in the example of an LED or LD. The LED is arranged and configured to expose the sample to different illumination intensities. The LED 109 provides continuous wave illumination and is mounted to the Hall effect card by an LED holder 108. To induce the Hall voltage $V_H$, a magnetic field is generated using a magnet 104 comprised by the system 100. Values of the magnetic field in the area of the sample 107 are measured using a Gauss probe 106. For example, the magnet 104 may be an electromagnet, a permanent magnet or another magnetic field source. The Constant Light Induced Magneto Transport (CLIMAT), i.e. the Hall effect under exposure of the sample 107 to light, can be measured using an alternating magnetic field (AC) or a constant magnetic field (DC).

Figure 2:
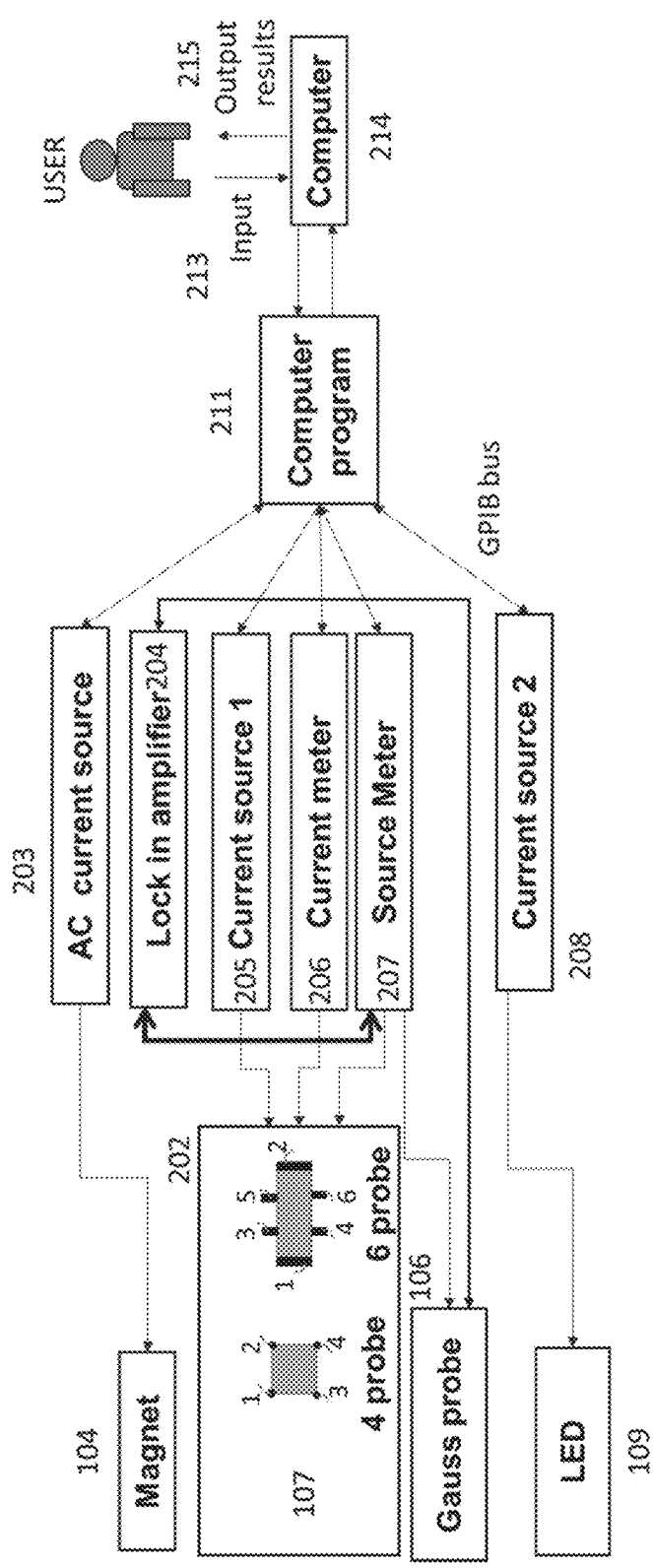
FIG. 2 shows an embodiment of the method and the computer program according to the first and the second aspect of the invention, wherein an AC magnetic field is applied.

FIG. 2 depicts an embodiment of the method and the computer program for determining respective transport properties of majority and minority charge carriers in a sample 107, according to the first and the second aspect of the invention. In this embodiment, the magnet 104 is driven by an AC current source 203 and controlled by a computer program 211 executed on a computer 214. The magnetic field frequency and amplitude are controlled by the Gauss probe 106, which is additionally connected to a lock-in amplifier 204 as a reference signal.

The sample 107 is loaded using 4-probe or 6-probe contact geometry card 202 electrically connected with the first current source 205, the current meter 206 and the source meter 207. The first current source 205 applies the electrical current through the sample. The applied electrical current is measured by the current meter 206. The source meter 207 probes the longitudinal voltage $V_{xx}$ for the calculation of the conductivity from $\sigma=I/(V_{xx}d)$ as well as the Hall voltage $V_H$ for the calculation of a corresponding Hall effect coefficient $R_H=V_H d/I_0B$, with $I_0$ the applied current and B the applied magnetic field. The voltages are measured at the output of the lock-in amplifier 204. The sign of the Hall coefficient is detected from the phase of the measured signal.

According to the invention, a first Hall measurement trial is performed at a first illumination intensity $I_1$ that is lower than 0.02 suns, particularly wherein the first illumination intensity is zero. In other words, the first Hall measurement is preferably performed in the dark. A second Hall measurement trial is performed at a second illumination $I_2$ that is chosen so high that the charge carrier density of both electrons and holes in the sample are essentially identical. Particularly, intermediate Hall measurement trials are performed at intensities between $I_1$ and $I_2$. The Hall measurement trials at finite, nonzero illumination intensities are performed to unlock the charge transport properties of both the majority and the minority charge carriers, since in the dark, the contribution to conduction essentially corresponds to the majority charge carriers. To this end, in this embodiment the sample is continuously illuminated by the LED

109. The illumination intensity is controlled by an electrical current applied to the LED 109 by the second current source 208. The skilled person will appreciate that the illumination intensity may also be provided and controlled by alternative light sources, such as for example a laser system, an optical fibre laser or a monochromator. All instruments are driven by the computer program 211 executed on the computer 214, which is in turn controlled by a user input 213 where the user can set the illumination intensities to and between $I_1$ and $I_2$, as well as an amplitude and frequency of the applied magnetic field, a duration of the individual Hall measurement trials, the current applied through the sample, lock in amplification parameters of the lock-in amplifier 204, and a number of intermediate Hall measurement trials to be executed between $I_1$ and $I_2$. The user input may also 213 allow for entering the sample thickness, which is used to calculate some of the transport properties. The user can also select the value of $\mu_1$ and $\mu_2$ from the acquired dependence of Hall mobility on the illumination intensity, $\mu_H(I)$. As a result of this selection, the computer program will recalculate the charge carrier density and charge carrier transport properties according to the selected values. In particular, the user can select correction algorithms 500, 900, 1000 disclosed below and apply them to see the effect of the correction algorithms 500, 900, 1000 on outputs 215, 313 of the method provided by the system 100. The sample 107 shown in block 202 of FIG. 2 may for example comprise a 4-probe geometry, where the longitudinal voltage $V_{xx}$ related to the conductivity is measured through the contacts 1-2, 2-4, 3-4, 1-3 when the current is applied to the contacts 3-4, 1-3, 1-2, 2-4, respectively. In the 6-probe contact geometry, the current is applied between the contacts 1-2, and the longitudinal voltage $V_{xx}$ is acquired between the contacts 3-5 and/or 4-6. For the Hall voltage $V_H$, in the 4-probe contact geometry, the current is applied diagonally across the sample 107 contacts between contacts 1-4 or 2-3, and the opposite diagonal contacts 2-3 or 1-4 are used to probe the Hall voltage $V_H$. In the case of the 6-probe geometry, the contacts 1-2 are used to apply the current through the sample 107, and the contacts 3-4 and/or 5-6 were used to probe the Hall voltage $V_H$.

The voltages are preferably acquired for both negative and positive applied currents and negative and positive magnetic fields, so that a non-uniformity of the sample 107 is minimized. The values acquired for negative and positive currents or magnetic fields are preferably averaged, as well as the voltages probed on the different contacts. For example, $V_{xx}=(0.5(V_{12I+}-V_{12I-})+0.5\ (V_{24I+}-V_{24I-})+0.5\ (V_{34I+}-V_{34I-})+0.5\ (V_{13I+}-V_{13I-}))/4)$. In the case of considerable voltage offset on the contacts, the voltage offset measured at a zero current and/or a drifting baseline voltage is preferably subtracted for both $V_{xx}$ and $\vec{V}_H$.

As an output 215 from the Hall measurement trials, the user receives the following transport properties: a majority and the minority charge carrier density $n_{1,3}$, a majority and the minority charge carrier mobility $\mu_{1,3}$, a majority and the minority charge carrier lifetime $\tau_{1,3}$, a majority and the minority charge carrier diffusion length $L_{1,3}$, a majority and the minority charge carrier diffusion coefficient $D_{1,3}$, a Quasi-Fermi level splitting of the majority and the minority charge carriers $QFLS_{1,3}$, an ideality factor $\eta$. The output in particular indicates abovementioned parameters as a function of illumination intensity or generation rate. Particularly, besides the majority and the minority charge carrier mobility that are independent of the illumination intensity, these transport properties are output as a function of the illumination intensity or the charge carrier density. The output 215 and 313 can also comprise data indicative of the conductivity $\sigma$, the Hall voltage $V_H$ or a Hall coefficient $R_H = V_H d/I_0 B$, a Hall mobility $\mu_H(I) = \sigma(I)R_H(I)$, a parasitic conductivity $\sigma_s$ and/or a dark charge carrier density $n_{1,corr}(I=0)$ can be output to the user by the output 215 and 313. The output 215 and 313 may for example be realized by means of a user interface or a screen that shows the transport properties particularly in a graphical representation to the user.

Figure 3:
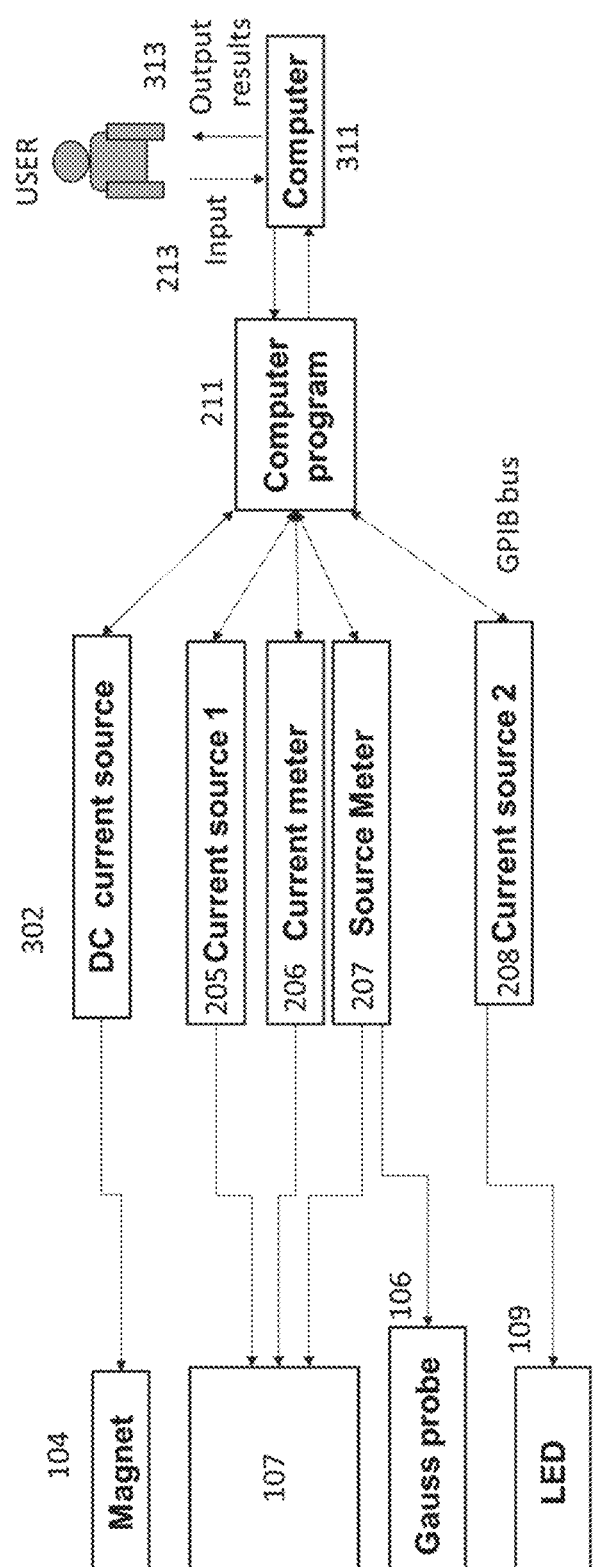
FIG. 3 shows an embodiment of the method and the computer program according to the first and the second aspect of the invention, wherein a DC magnetic field is applied.

FIG. 3 shows an alternative embodiment of the method and the computer program for determining respective transport properties of majority and minority charge carriers in a sample 107, according to the first and the second aspect of the invention. In this embodiment, the magnet 104 is not driven by the AC current source 203 as in FIG. 2 but by a DC current source 302. The present embodiment does thus not require the lock-in amplifier 204. The voltages $V_{xx}$ and $V_H$ are therefore acquired directly from the respective contacts by the source meter 207, without the lock-in amplifier.

Figure 4:
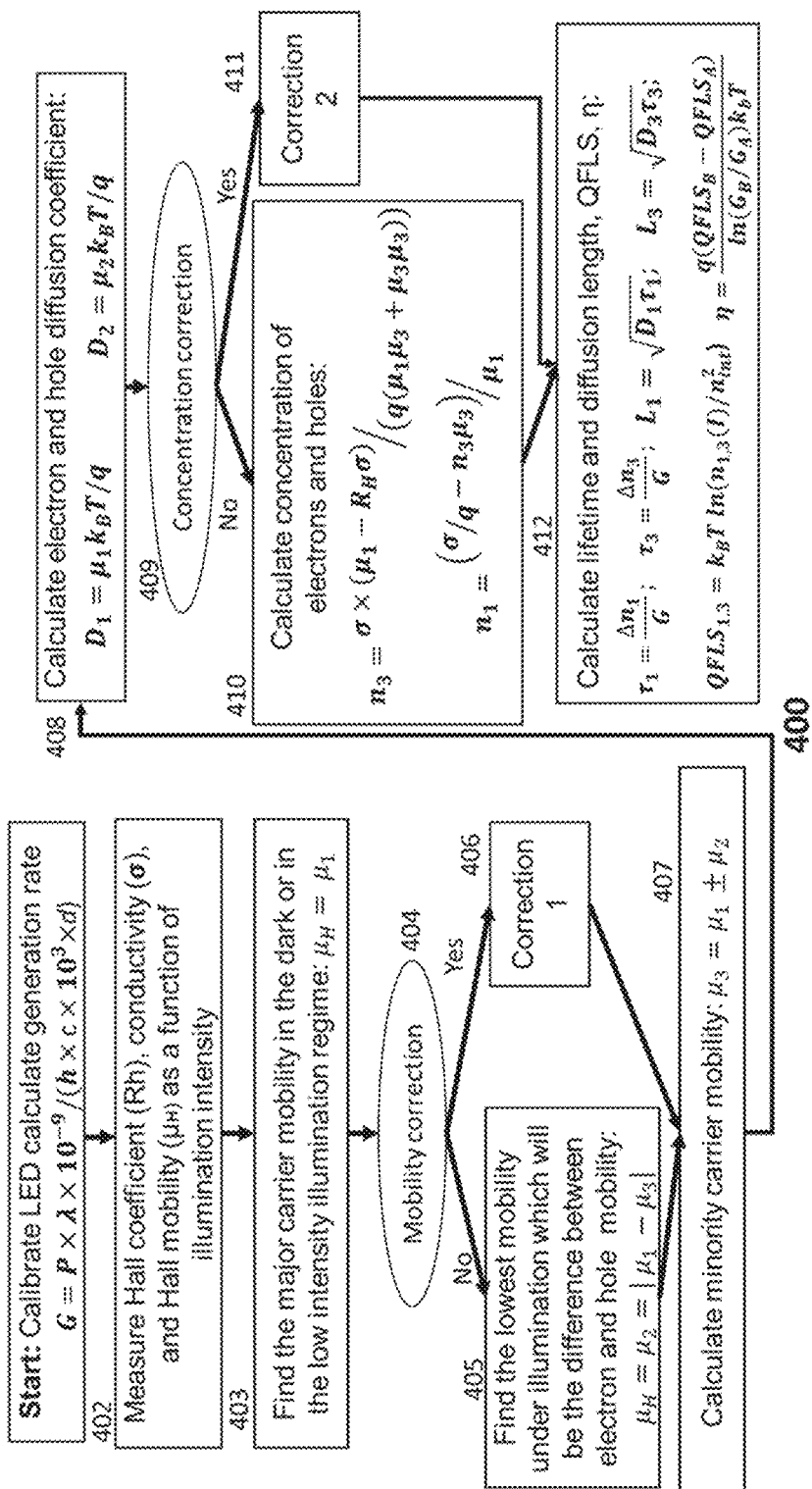
FIG. 4 shows a flowchart of an embodiment of the method and the computer program according to the first and the second aspect of the invention.

FIG. 4 shows a flowchart of an embodiment of the method and the computer program for determining respective transport properties of majority and minority charge carriers in a sample 107 according to the first and the second aspect of the invention. This embodiment is preferably applied for similar majority and minority charge carrier densities, for example similar within 15%. In this embodiment, in first step 401, the LED 109 is calibrated using a light power meter 401 and a generation rate is calculated from $G = I\lambda 10^{-9}/hc10^3 d$, where I is the illumination intensity, $\lambda$ the wavelength of electromagnetic radiation providing the illumination and d a thickness of the sample 107, h is Planck's constant and c is the speed of light.

Next, in step 402, the longitudinal voltage $V_{xx}$ and Hall voltage $V_H$ are measured as a function of the generation rate, particularly of the illumination intensity, to find the Hall coefficient, the conductivity, and the Hall mobility as a function of the illumination intensity.

From the Hall coefficient and conductivity, particularly the Hall mobility as a function of generation rate, the majority and the minority charge carrier mobilities are found. The majority carrier mobility is found at the first illumination intensity $I_1$, particularly in the dark. Here, the measured Hall mobility corresponds to the majority charge carrier mobility $\mu_H(I_1) = \mu_1$.

Figures 8A, 8B, 8C, 8D:
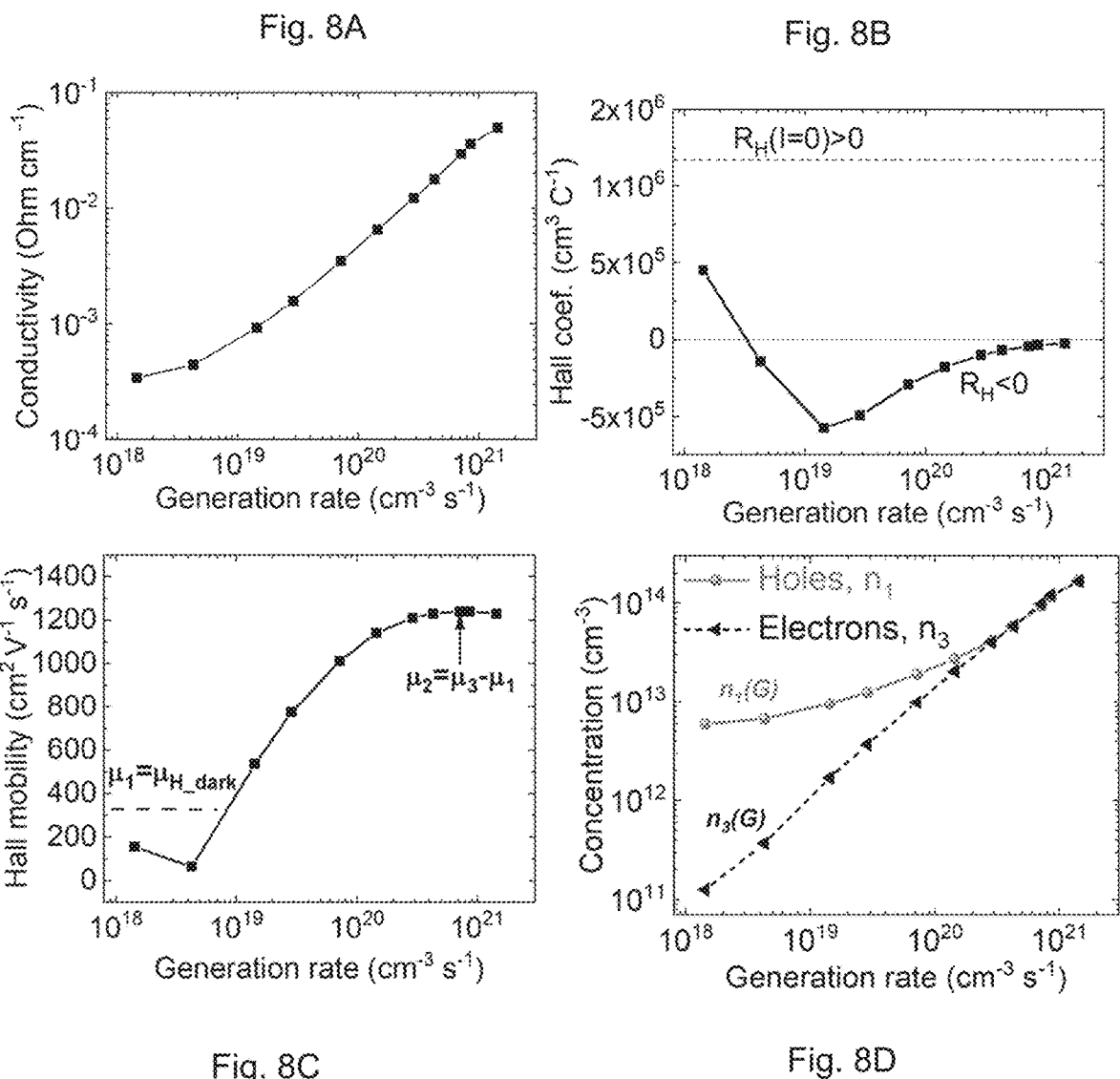
FIGS. 8A-8D show a conductivity (FIG. 8A), a Hall coefficient (FIG. 8B) and a Hall mobility (FIG. 8C) acquired on a silicon sample as well as the majority and the minority charge carrier densities (FIG. 8D) determined therefrom, as a function a generation rate proportional to the illumination intensity.
Figures 10A, 10B, 10C, 10D, 10E, 10F:
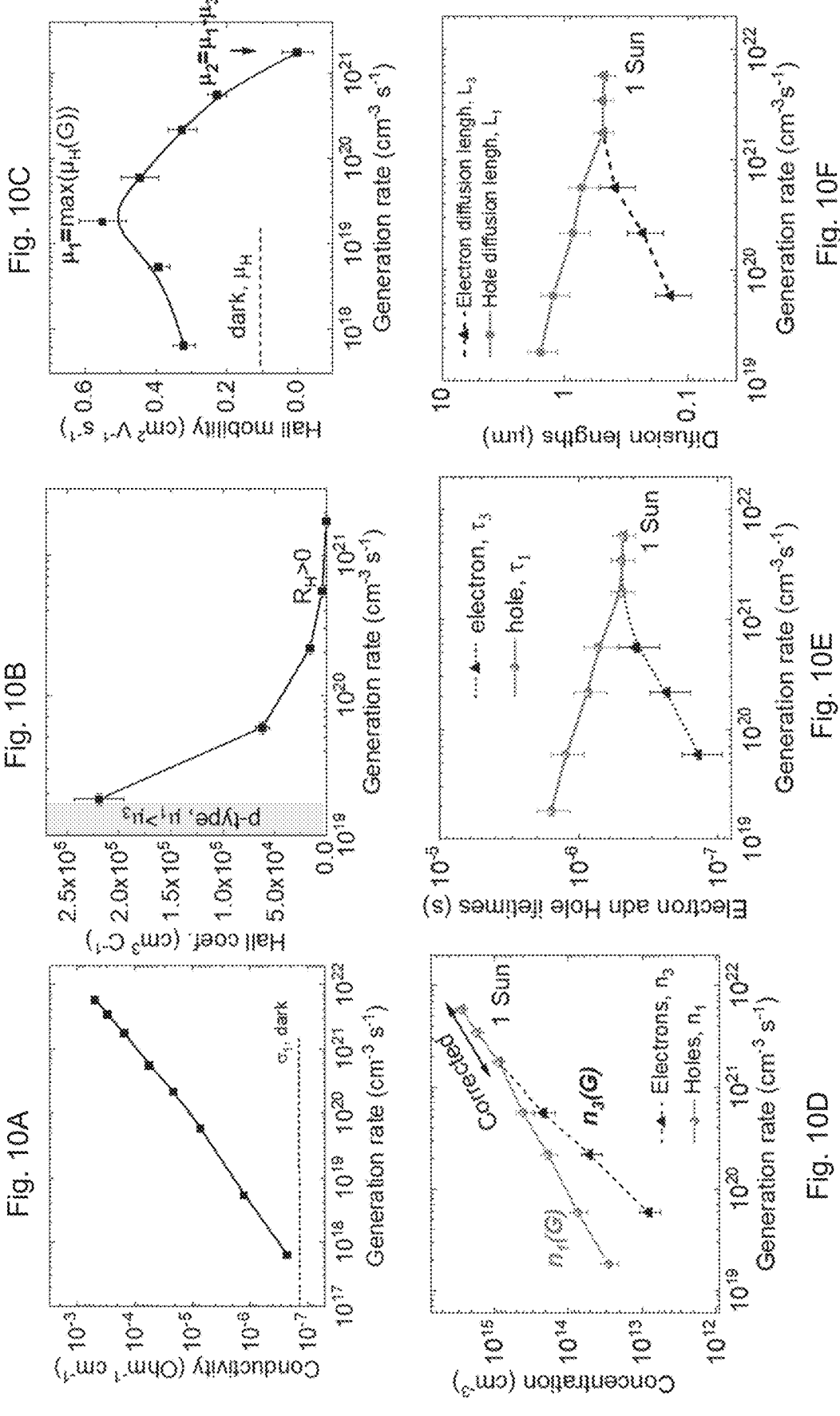
FIGS. 10A-10F show the conductivity (FIG. 10A), the Hall coefficient (FIG. 10B), the Hall mobility (FIG. 10C), the charge carrier density (FIG. 10D), the electron- and hole lifetimes (FIG. 10E) and the diffusion lengths (FIG. 10F) for a Perovskite sample as a function of the generation rate

In step 405, the absolute value of the difference between majority ($\mu_1$) and minority charge carrier mobility ($\mu_3$), $\mu_H(I_2) = \mu_2 = |\mu_1 - \mu_3|$, is found at high intensities, particularly at $I_2$, where the charge carrier density of holes and electrons are essentially identical. For intensities in the regime of $I_2$, it is a signature of identical charge carrier densities of electrons and holes that the Hall coefficient asymptotically approaches zero, cf. FIG. 8b for a silicon sample and FIG. 10b for a Perovskite sample. In particular, FIG. 8b illustrates the asymptotic behavior of the Hall coefficient observed once the generation rate is increased beyond $3 \times 10^{18}$ $cm^{-3}s^{-1}$: Due to the much larger mobility of electrons, the Hall coefficient first drops steeply as the illumination is increased from $I_1$ and changes its sign from positive to negative. If the illumination is further increased towards $I_2$, the Hall coefficient features the characteristic asymptotical approach, particularly increase, towards zero. Particularly, for the silicon sample, at $I_2$ the acquired Hall mobility features a saturation, where the charge carrier densities essentially coincide, cf. FIGS. 8c and 8d.

In step 407, from the majority charge carrier mobility, particularly of holes, determined in step 403 at $I_1$ and the absolute value of the difference between the majority and the minority charge carrier mobility determined at step 405 at $I_2$, the minority charge carrier mobility is found.

In the case of parasitic conductivity, correction step 406 using a correction algorithm 900 is applied to calculate corrected values for i) the mobilities of the minority and majority charge carriers, ii) the charge carrier density at low illumination, particularly in the dark, and iii) the parasitic conductivity. The correction algorithm 900 is further illustrated in the flowchart of FIG. 6. The parasitic conductivity can include surface conductivity, ionic conductivity, grain boundaries conductivity and conductivity non-uniformities. In the case of low Hall coefficient below the sensitivity of the source meter 207 and/or high doping, particularly for doping densities beyond $10^{14}$ $cm^{-3}$ of the sample 107, correction step 904 from the correction algorithm 900 can be used to calculate corrected values for the absolute difference between the majority and the minority charge carriers mobilities.

The next steps include the calculation of the majority and minority charge carrier diffusion coefficient in step 408 using the now known values of the majority and minority charge carrier mobility. The charge carrier density of the majority and minority charge carriers is calculated in step 410 using equations 3-4.

Figure 7:
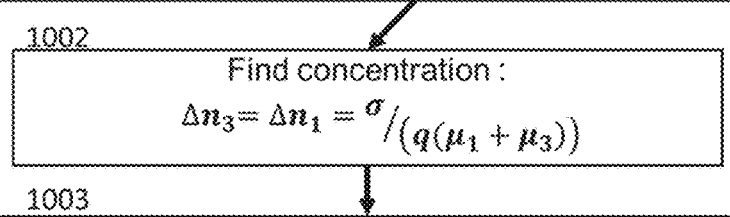
FIG. 7 shows a flowchart of a correction algorithm used to determine a corrected value of the carrier density at the second illumination intensity, in case of a low Hall coefficient.

In the case of a low Hall signal, particularly for signal-to-noise-ratios of less than one, which is particularly the case if the majority and minority charge carrier mobilities are similar, correction steps 409 and 411 are performed to find the photogenerated charge carrier density using correction algorithm 1000, which is further illustrated in the flowchart of FIG. 7.

From the known charge carrier densities $n_{1,3}$, mobility $\mu_{1,3}$ and diffusion coefficient $D_{1,3}$, the transport properties lifetime and diffusion length can be found for electrons and holes separately in step 412. Moreover, the Quasi-Fermi level splitting (QFLS) and the ideality factor can be further calculated in step 412 to predict the performance of the investigated sample 107, particularly the studied semiconductor, as an active material particularly in a solar cell.

FIG. 5 shows a flowchart of a further embodiment of the method and the computer program for determining respective transport properties of majority and minority charge carriers in a sample 107 according to the first and the second aspect of the invention. In this embodiment, a correction algorithm 500 is used for samples 107 which show a negligible minority charge carrier signal compared to the majority charge carrier signal. The charge carrier signals particularly comprise the measured conductivity and the Hall coefficient. Such a negligible minority charge carrier signal is for example found in p-i-n solar cells, in particular in electron and hole charge transport layers.

As for the embodiment of FIG. 4, here in FIG. 5, the LED 109 is calibrated in step 501, and the conductivity, the Hall coefficient and the Hall mobility is acquired as a function of the generation rate in step 502. Next, in steps 503 to 506, the majority charge carrier mobility, the majority charge carrier diffusion coefficient, the majority charge carrier density and further transport properties of the majority charge carriers, particularly the lifetime and the diffusion length are determined. In step 503, the correction algorithm 900 can be used in the case of parasitic conductivity. Also, correction algorithm 1000 can be used in step 505 to correct the majority charge carrier density using conductivity $$\left(n_1 = \sigma(I)/(q(\mu_1))\right)$$

in the case of an undetectable Hall effect signal.

FIG. 6 shows a flowchart of the correction algorithm 900 used to determine respective corrected values of the majority charge carrier mobility and the majority charge carrier density in case of parasitic conductivity. As an initial step 901 of the correction algorithm 900, the conductivity and the Hall mobility acquired as a function of generation rate during the Hall measurement trials are used as input data for the correction algorithm 900. In step 902, the corrected majority charge carrier mobility is found from $\mu_{1,corr}$=max $(\mu_H(I))$.

In step 903, the corrected majority charge carrier density at zero illumination is found from $n_{1,corr}(I{=}0){=}\mu_H(I_1)\sigma/q(\mu_{1,corr})^2$, wherein $I_1$ is preferably chosen to be zero, and the parasitic conductivity is calculated from $\sigma_s{=}\sigma(I_1){-}q\mu_{1,corr}n_{1,corr}(I_1)$. Subsequently, in step 904, the absolute value of the difference between hole and electron mobility is calculated from respective Hall mobilities and conductivities acquired at two different intensities $I_C$ and $I_D$ from $$\mu_2 = \left|(\mu_H(I_D)\sigma(I_D) - \mu_H(I_C)\sigma(I_C))/(\sigma(I_D) - \sigma(I_C))\right| = |\beta|,$$

wherein $\mu_3$ is determined by adding the first and the second charge carrier mobility if $\beta{<}0$ and $(\mu_H(I_D){<}\mu_H(I_C))$, or if $\beta{>}0$ and $\mu_H(I_D){>}\mu_H(I_C)$ and wherein $\mu_3$ is determined by subtracting the second charge carrier mobility from the first charge carrier mobility, if $\beta{>}0$ and $\mu_H(I_D){<}\mu_H(I_C)$.

Upon correction of the majority charge carrier mobility in step 905, the method and/or computer program shown in the embodiment of FIG. 4 proceeds with step 407 to calculate the values of the hole and electron mobility.

FIG. 7 depicts a flowchart of the correction algorithm 1000 used to determine a corrected value of the photogenerated charge carrier density at the second illumination intensity, in case of a low Hall coefficient, particularly when the signal to noise ratio is less than 1. Such a low Hall coefficient typically occurs as a consequence of essentially identical carrier densities of majority and minority charge carriers. In an initial step 1001, the conductivity acquired as a function of the generation rate, the electron mobility and the hole mobility are used as input data for the correction algorithm 1000. The photogenerated charge densities of major and minor carriers may then be found from $$\Delta n_1(I) = \Delta n_3(I) = (\sigma(I) - \sigma(I = 0))/(q(\mu_1 + \mu_3))$$

in step 1002.

Particularly, in general, to determine the transport properties of the majority and the minority charge carriers the

16 conductivity $\sigma$ is determined from the applied current $I_0$ and the measured longitudinal voltage $V_{xx}$, $\sigma{=}I_0/(V_{xx}d)$ and the Hall coefficient determined from $R_H{=}V_Hd/I_0B$ are determined experimentally.

To determine the respective transport properties of the majority and the minority charge carriers buried in the acquired conductivity and the Hall coefficient, the experimentally determined conductivity and the Hall coefficient are associated to their theoretical equivalents given by equations 1 and 2:

$$\sigma = e(\mu_1 n_1 + \mu_3 n_3) \qquad \text{(equation 1)}$$

$$\begin{cases} \text{if holes are majority} \\ \text{charge carriers, } R_H(I_1) > 0 \end{cases} \ R_H = \frac{(\mu_1^2 n_1 - \mu_3^2 n_3)}{e(\mu_1 n_1 + \mu_3 n_3)^2} \qquad \text{(equation 2)}$$
$$\begin{cases} \text{if electrons are majority} \\ \text{charge carriers, } R_H(I_1) < 0 \end{cases} \ R_H = \frac{(-\mu_1^2 n_1 + \mu_3^2 n_3)}{e(\mu_1 n_1 + \mu_3 n_3)^2}$$

The charge carrier densities of majority and minority charge carriers can be found using equations 3 and 4 by resolving the conductivity and the Hall coefficient equations, as the impact of majority and minority charge carriers is combined (Eq. 1) and subtracted (Eq. 2), respectively.

$$\begin{cases} \text{if holes are majority} & n_3 = \sigma \times (\mu_1 - R_H\sigma)/ \\ \text{charge carriers, } R_H(I_1) > 0 & (q(\mu_1\mu_3 + \mu_3\mu_3)) \\ \text{if electrons are majority} & n_3 = \sigma(\mu_3 + R_H\sigma)/ \\ \text{charge carriers, } R_H(I_1) < 0 & (q(\mu_1\mu_3 + \mu_1\mu_1)) \end{cases} \qquad \text{(equation 3)}$$

$$n_1 = (\sigma/q - n_3\mu_3)/\mu_1 \qquad \text{(equation 4)}$$

To resolve the majority and minority charge carrier densities, the majority and minority charge carrier mobility are needed and can be found from the first Hall measurement trial at the first illumination intensity, particularly at zero illumination, as well as the second Hall measurement trial at the second illumination intensity. The Hall mobility comprising contributions of both the majority and the minority charge carriers (cf. equation 5) is the product of the conductivity and the Hall coefficient $\mu_H(I){=}\sigma(I)R_H(I)$.

$$\mu_H = \left| \frac{(\mu_1^2 n_1 - \mu_3^2 n_3)}{(\mu_1 n_1 + \mu_3 n_3)} \right| \qquad \text{(equation 5)}$$

$$\begin{cases} n_1 \gg n_3 & \Rightarrow & \mu_H = \mu_1; \\ n_3 \gg n_1 & \Rightarrow & \mu_H = \mu_3; \\ n_1 = n_3 & \Rightarrow & \mu_H = \mu_2 = |\mu_1 - \mu_3| \end{cases} \qquad \text{(equation 6)}$$

Equation 5 predicts that the Hall mobility is equal to the majority charge carrier mobility at the first illumination, particularly at zero illumination, cf. also equation 6. Further, the charge carrier densities of the majority and the minority charge carriers are essentially identical at high illuminations on the order of $I_2$. In this illumination regime, the Hall mobility becomes equal to the absolute value of the difference between the majority and the minority charge carrier mobility, cf. equation 6. Using this approach, the majority and the minority charge carrier mobilities can be found.

The majority and the minority charge carrier mobilities are independent of illumination due to the uniform distribution of free carriers. In addition, no experimental evidence for mobility variations was observed, as confirmed by the saturation of the Hall mobility at a constant mobility value shown in FIG. 8c without a further change, particularly increase, of the Hall mobility upon saturation.

After finding the respective mobilities and charge carrier densities of the majority and the minority charge carriers, the charge transport properties of the majority and the minority charge carriers are calculated using equations 7-10. The generation rate $G=P\times\lambda\times10^{-9}/(h\times c\times10^{3}\times d))$ can be determined, preferably in units of $cm^{-3}s^{-1}$, by calibration of the used LED 109 or by using a pre-calibrated LED 109.

$$\tau_{1,3}(G) = [n_{1,3}(G) - n_{1,3}(G = 0)]/G, \qquad \text{(equation 7)}$$

$$D_{1,3} = \mu_{1,3}k_BT/q \qquad \text{(equation 8)}$$

$$L_{1,3} = \sqrt{D_{1,3}\tau_{1,3}} \qquad \text{(equation 9)}$$

Advantageously, with both the majority and the minority charge carrier densities being known, the respective $QFLS_{1,3}$ (cf. equation 10) can be determined. The total QFLS can be found summing up $QFLS_1$ and $QFLS_3$, or by $QFLS_{total}=k_BT \ln(n_1n_3/n_{int}^2)/q$. $QFLS_{total}$ is related to the highest open circuit voltage ($V_{OC}$) which the examined sample 107, particularly the investigated semiconductor, can support. Practically, this means that the present invention allows to predict the performance of materials as a solar cell absorber, without needing to fabricate and test the full solar cell device. In equation 10, $n_{int}$ denotes the intrinsic carrier density at zero illumination, $n_{int}=\sqrt{n_1(G=0)n_3(G=0)}$. Further, from the now known QFLS, the solar cell ideality factor is determined from Equation (11).

$$QFLS_{1,3} = k_BT\ln(n_{1,3}(I)/n_{int}^2) \qquad \text{(equation 10)}$$

$$\eta = \frac{q(QFLS_B - QFLS_A)}{\ln(G_B/G_A)k_bT} \qquad \text{(equation 11)}$$

Parasitic conductivity, such as surface conductivity, ionic conductivity, grain boundaries conductivity, and conductivity non-uniformities influence the Hall measurement trials by an extra term $\sigma_s$ which contributes to the acquired conductance but not to the Hall coefficient or –coefficient due to the low mobility of parasitic charge carriers, which is negligible compared to the mobilities of the majority and the minority charge carriers. Therefore, in case of parasitic conductivity, the Hall mobility and the conductivity must include $\sigma_s$ as according to equations 12 and 13.

The impact of free carriers in the bulk of the sample on the conductivity can be boosted to overcome $\sigma_s$ by illumination. In such conditions, the contribution of photogenerated majority charge carriers, particularly holes, $q\mu_1n_1$, will overcome the value of $\sigma_s$ and increase up to the value of the actual, corrected majority charge carrier mobility $\mu_{1,corr}$, as predicted by equations 12 to 14.

By finding the majority charge carrier mobility, particularly the hole mobility, as a peak value, $\mu_{1,corr}=\max(\mu_H(I))$, the dark conductivity $\sigma(I_1=0)$ and the Hall coefficient can be used to determine the corrected dark majority charge carrier density $n_{1,corr}(I=0)=\mu_H(I_1)\sigma(I_1)/q(\max(\mu_H(I)))^2$. The parasitic conductivity can then be determined from $\sigma_s=\sigma(I_1)-q\mu_{1,corr}n_{1,corr}(I_1)$.

When the majority and the minority charge carriers have the same or similar mobility values, particularly within 15%, and/or when sample 107 is highly doped so that photogenerated charge carriers do not overcome the dark charge carrier density particularly for $n_1(I=0)>10^{14}$ $cm^{-3}$, the Hall mobility tends to decrease at higher intensities as the contributions of majority and minority charge carriers cancel each other, which is confirmed by simulations based on equation 12. To neglect the effect of parasitic conductivity on Hall mobility and find minority carrier mobility, neighbor Hall mobility points measured as a function of intensity can be used, particularly wherein the neighbored point are measured at a first intensity $I_C$ and a second intensity $I_D$ between $I_1$ and $I_2$ and wherein $I_D$ exceeds $I_C$ by at least 25%.

$$\mu_H = |e(\mu_1^2n_1 - \mu_3^2n_3)/(\sigma_s + e(\mu_1n_1 + \mu_3n_3))| \qquad \text{(equation 12)}$$

$$\sigma = \sigma_S + e\mu_1n_1 + e\mu_3n_3 \qquad \text{(equation 13)}$$

$$\begin{cases} e(\mu_1n_1) \gg \sigma_s \implies \mu_{1,corr} = \max(\mu_H(G)) \qquad \text{(equation 14)} \\ \qquad\qquad \mu_1 - \mu_3 = \mu_2 = \\ n_1 \approx n_3 \implies \left|\dfrac{(\mu_H(J_D)\sigma_D(J_D) - \mu_H(J_C)\sigma_C(J_C))}{(\sigma_D(J_D) - \sigma_C(J_C))}\right| = |\beta| \end{cases}$$

Thus according to the determined $\mu_2$ and $\beta$, the value of $\mu_3$ is determined by adding the first and the second charge carrier mobility if $\beta<0$ and ($\mu_H(I_D)<\mu_H(I_C)$), or if $\beta>0$ and $\mu_H(I_D)>\mu_H(I_C)$ and $\mu_3$ is determined by subtracting the second charge carrier mobility from the first charge carrier mobility, if $\beta>0$ and $\mu_H(I_D)<\mu_H(I_C)$.

Some materials—such as halide perovskites and organic semiconductors-demonstrate similar values of the majority and the minority charge carrier mobilities, which leads to a very low Hall coefficient as electrons and holes cancel out each other, cf. equation 5. In such conditions, particularly for Hall coefficients with signal-to-noise-ratios below 1, which typically occur at high illumination intensities higher than 0.1 Sun, the photogenerated electron and hole charge carrier densities can be calculated using the conductivity value as shown in equation 15.

$$\Delta n_1(I) = \Delta n_3(I) = (\sigma(I) - \sigma(I = 0))/(e(\mu_1 + \mu_3)) \qquad \text{(equation 15)}$$

Figures 9A, 9B, 9C, 9D:
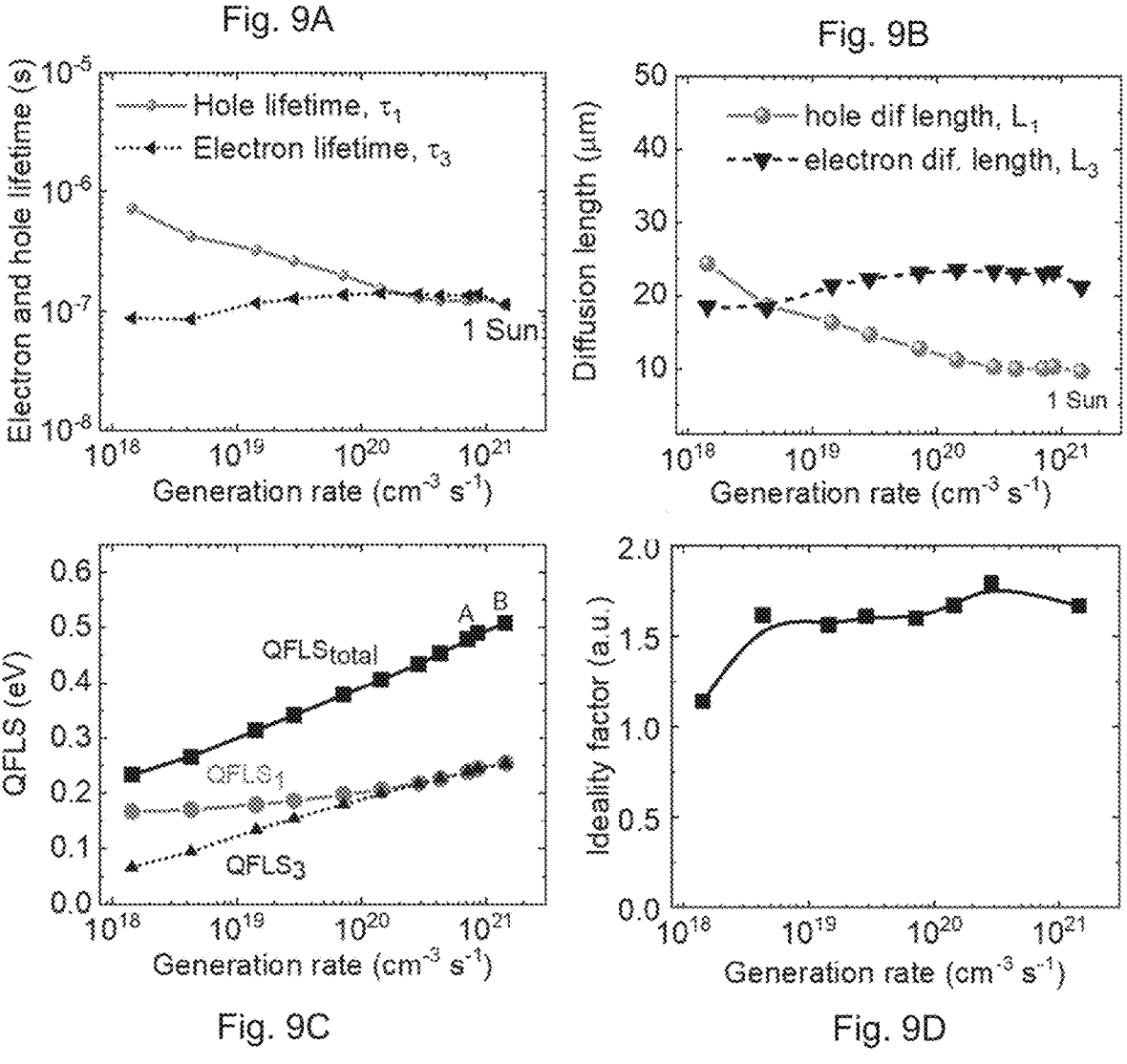
FIGS. 9A-9D show the electron- and hole lifetime (FIG. 9A), the electron and hole diffusion length (FIG. 9B), the QFLS (FIG. 9C) and the ideality factor (9d) determined for the silicon sample based on the quantities shown in FIGS. 8A-8D.

FIGS. 8 to 10 demonstrate the application of the present invention based on the above considerations for two examples i) in a first sample 107 comprising p-type Silicon and ii) in a second sample 107 comprising wide bandgap (Eg=1.8 eV) halide perovskite.

To determine the charge carrier properties of the respective sample 107, the sample 107 was exposed to electromagnetic radiation using an LED 109. Both samples 107 were investigated according to the method presented in the embodiment of FIG. 4, with the measurement setup of FIG. 2, using an AC magnetic field for the Hall measurement trials. The first sample (Silicon) was exposed to electromagnetic radiation at a wavelength of 823 nm and the second sample (Perovskite) was exposed to electromagnetic radiation at a wavelength of 620 nm.

FIGS. 8a-d show the conductivity (FIG. 8a), the Hall coefficient (FIG. 8b), the Hall mobility (FIG. 8c) and the majority and the minority charge carrier densities (FIG. 8d) for the first sample, i.e. the silicon sample, as a function of the generation rate. The first sample comprises a thickness of 280 μm.

In the dark, at zero illumination, the silicon sample features a positive Hall coefficient, and thus a positive Hall coefficient, which proves its p-type conductivity (cf. FIG.

8$b$). The majority charge carriers are therefore identified as holes. The free hole mobility $\mu_1 = \mu_h = 328$ cm$^2$V$^{-1}$s$^{-1}$ is found in the dark conditions where the hole density of $n_1(I_1=0) = p_0 = 4.9 \times 10^{12}$ cm$^{-3}$ dominates. The Hall coefficient reverses its sign as illumination intensity increases and the carrier density approaches the dark hole density. It is well established that electrons have a much larger mobility than holes in Silicon. Thus, due to the much larger impact of the electrons $$(-\mu_3^2 n_3)$$

in the Hall coefficient, the sign of the Hall coefficient becomes negative at $n_3 > p_0$ predicted by equation 2.

The absolute value of the difference between electron and hole mobility, $|\mu_3 - \mu_1| = \mu_2 = 1240$ cm$^2$V$^{-1}$s$^{-1}$ can be found at generation rates $G > 7 \times 10^{20}$ cm$^{-3}$s$^{-1}$ where we observe apparent saturation of the Hall mobility due to essentially identical photogenerated charge carrier densities of holes and electrons, cf. equation 6. As a result, the electron mobility value $\mu_3 = \mu_e = 1568$ cm$^2$V$^{-1}$s$^{-1}$ is found by adding the hole mobility value. Electron and hole diffusion coefficients $D_e = 40.6$ cm$^2$s$^{-1}$ and $D_h = 8.5$ cm$^2$s$^{-1}$ are assessed using mobilities values and Equation 8.

Now, with the electron and hole mobility, the charge carrier density of holes and electrons can be calculated separately using equations 3-4. FIG. 8$d$ shows the charge carrier densities of electrons and holes as a function of the illumination intensity, up to one sun. As expected for p-type semiconductors, the hole carrier density dominates at low and moderate illumination conditions up to G of $4.3 \times 10^{20}$ cm$^{-3}$s$^{-1}$, after which $n_3$ and $n_1$ merge. The observed behavior of charge carrier densities as a function of G is in perfect agreement with $\mu_H(G)$ and $R_H(G)$, which feature saturation and sign reversal, FIG. 11$b$.

With the revealed charge carrier densities of holes and electrons as a function of the generation rate respective charge carrier properties of both electrons and holes can be calculated using equations 7-10. FIGS. 9$a$-$d$ show the electron- and hole lifetime (FIG. 9$a$), the electron and hole diffusion length (FIG. 9$b$), the electron and hole QFLS (FIG. 9$c$), the total QFLS, and the ideality factor (9$d$).

The hole lifetime (cf. FIG. 9$a$) shows a decrease as a function of the generation rate reaching the value $1.16 \times 10^{-7}$ s at one sun illumination (generation rate $3.7 \times 10^{20}$ cm$^{-3}$s$^{-1}$). The electron lifetime did not change significantly with increasing generation rate and reached a similar value of a lifetime of $1.14 \times 10^7$ at one sun. This behavior of the electron and the hole lifetime is typical for p-type semiconductors where the holes lifetime is controlled by the density of minority carriers (electrons). The slight increase in electron lifetime at a low generation rate is possible due to the occupation of an electron trap. Note that the lifetime of holes and electrons only merge at moderate generation rates larger than $4.3 \times 10^{20}$ cm$^{-3}$s$^{-1}$.

Using the values of lifetimes and mobilities, the diffusion lengths can be obtained (cf. FIG. 9$b$ and equation 9). The diffusion lengths of electrons and holes, $L_e$ and $L_h$, mimic the dependence of lifetime on the generation rate and reach 21.2 $\mu$m and 9.7 $\mu$m at one sun, respectively. Having revealed the carrier densities of electrons and holes allows to predict how the studied silicon sample performs as an active material in solar cell devices using Equations 10 and 11. The silicon sample shows a QFLS$_{Si} = 0.51$ eV and an ideality factor $\eta_{Si} = 1.66$, which gives insight into the dominant charge recombination mechanism. The ideality factors in the range $1 < \eta < 2$ indicate the effect of non-radiative recombination on the charge transport. The detected charge transport parameters agree with previously reported values.

FIGS. 10$a$-$f$ concern the second sample 107, comprising halide perovskite with similar hole and electron mobilities. In such a system, the electron and holes can completely compensate each other and lead to an extremely low Hall voltage or Hall coefficient that may be on the order of the noise level of the Hall measurement trial, making it possibly undetectable. In addition, the perovskite film is much thinner (500 nm) than the silicon sample (280 $\mu$m), and thus the parasitic conductivity of surface and grain boundaries cause a stronger impact of the parasitic conductance on the Hall coefficient, compared to the silicon sample.

Therefore, the correction algorithm 900 (depicted in FIG. 6 and equations 12-15) was applied to reveal corrected values for the charge transport parameters in perovskite films.

As can be seen in FIG. 10$b$, the Hall coefficient in the low illumination limit comprises a positive sign, such that the majority charge carriers can be identified as holes. In the dark, at zero illumination, the perovskite sample featured a hole carrier density $\widetilde{p_0} = 10^{13}$ cm$^{-3}$ and a Hall mobility 0.08 cm$^2$V$^{-1}$s$^{-1}$. The perovskite sample was then exposed to 617 nm electromagnetic radiation using the LED 109, to generate photogenerated charge carriers in the perovskite film. The conductivity, the Hall effect coefficient and the Hall mobility are shown in FIGS. 10$a$-$c$. The observed increase in conductivity and the decrease in the Hall coefficient with generation rate is caused by an increase in carrier density, cf. equations 1-2. Initially, the Hall mobility increases up to a generation rate of $1.8 \times 10^{19}$ cm$^{-3}$s$^{-1}$, after which it starts to decrease. The initial increment behavior of the Hall mobility points at parasitic conductivity, which influences the Hall mobility as anticipated by equations 12-14. For high illuminations towards 1 sun, the decrease in the Hall mobility points to a comparable value of electron and hole mobility, such that their contributions compensate each other due to the opposite charge polarity, as predicted by equation 12.

After applying the correction approach, a hole mobility of 0.55 cm$^2$V$^{-1}$s$^{-1}$ is found from the peak value in FIG. 10$c$, $\mu_{1,corr} = \max(\mu_H(G))$, the point where the conductivity of photogenerated holes dominates over $\sigma_S$. With this value, the data from the first Hall measurement trial performed in the dark can be corrected using the correction algorithm 900 (depicted in FIG. 6 and equations 12-14), yielding a corrected dark hole carrier density $p_0 = 6 \times 10^{10}$ cm$^{-3}$ and parasitic conductivity $\sigma_S = 8 \times 10^{-8}\Omega^{-1}$cm$^{-1}$. The correct value of the hole charge carrier density is more than one order magnitude lower than the value found by the classical approach ($\widetilde{p_0} = 10^{13}$ cm$^{-3}$) which highlights the superior capabilities of the CLIMAT correction approach.

The absolute value of the difference between the hole and electron mobility $|\mu_3 - \mu_1| = \mu_2 = 0.03$ cm$^2$V$^{-1}$s$^{-1}$ was found using Equation 14 and neighbor points of the Hall mobility and conductivity. The value of the electron mobility 0.52 cm$^2$V$^{-1}$s$^{-1}$ is in full agreement with the initial hypothesis of similar values of hole and electron mobility. Electron and hole diffusion coefficients $D_3 = 1.35 \times 10^{-2}$ cm$^2$s$^{-1}$ and $D_1 = 1.42 \times 10^{-2}$ cm$^2$s are found using perovskite electron and hole mobilities.

The charge carrier densities feature a dominance of holes up to a generation rate $10^{21}$ cm$^{-3}$s$^{-1}$, after which the charge carrier density of electrons and holes merge, cf. FIG. 10$d$.

The merging of $n_3$ and $n_1$ (n and p) is in agreement with the decrease in Hall mobility below set up the resolution (less than 0.03 $cm^2V^{-1}s^{-1}$).

The carrier lifetimes and diffusion lengths were calculated from the charge carrier densities of electrons and holes (Equations 7-9) and are plotted FIG. 10$e$ and FIG. 10$f$. The lifetime of holes decreases with increasing generation rate (from 1.6 $\mu$s to 476 ns), as expected in a p-type material. Interestingly, the electron lifetime shows an increase (from 138 ns to 476 ns) which can be assigned to the occupation of an electron trap, and, thus, a boost of the electron lifetime. At high generation rates ($>10^{21}$ $cm^{-3}s^{-1}$) the lifetimes of holes and electrons merge because of the equal density of holes and electrons. The comparison of CLIMAT steady state lifetime to other methods, particularly transient methods, is challenging as experiments are performed at different conditions.

The diffusion length, assessed from the lifetime and mobility values, mimics the dependence of lifetime on the generation rate. At one sun power, electrons and holes show similar diffusion lengths $L_1 \approx L_3 = 0.48$ $\mu$m. The steady-state diffusion lengths of the electrons and holes are in good agreement with previously reported values in literature. Finally, the total Quasi-Fermi level splitting and the ideality factor of perovskite were calculated, $QFLS_{pero}=1.43$ eV and $\eta_{pero}=1.7$. The ideality factor suggests that the non-recombination in perovskite material is similar to Silicon ($\eta_{Si}=1.66$). The diffusion length obtained for perovskites larger than the thickness of the material, pointing to an effective transport of free charges.

Summarizing, for the Silicon and the perovskite sample, fourteen transport properties—$n_{1,3}$, $\mu_{1,3}$, $\tau_{1,3}$, $L_{1,3}$ $D_{1,3}$, $QFLS_{1,3}$, $QFLS_{total}$, and $\eta$ have been determined as a function of illumination intensity based on the present invention. In contrast, standard Hall effect measurements can provide only two properties: $n_1$ and $\mu_1$. In particular, the invention allows to for the first time to distinguish the transport properties of the majority and the minority charge carriers so as to determine respective transport properties of majority and minority charge carriers and their charge carrier densities. Moreover, to overcome the limitation of the CLIMAT method for the perovskite material, an embodiment of the invention successfully provides a correction methods which allows to account for influences of parasitic conductance, doping, and low signal to noise ratios.

Figures 11A, 11B:
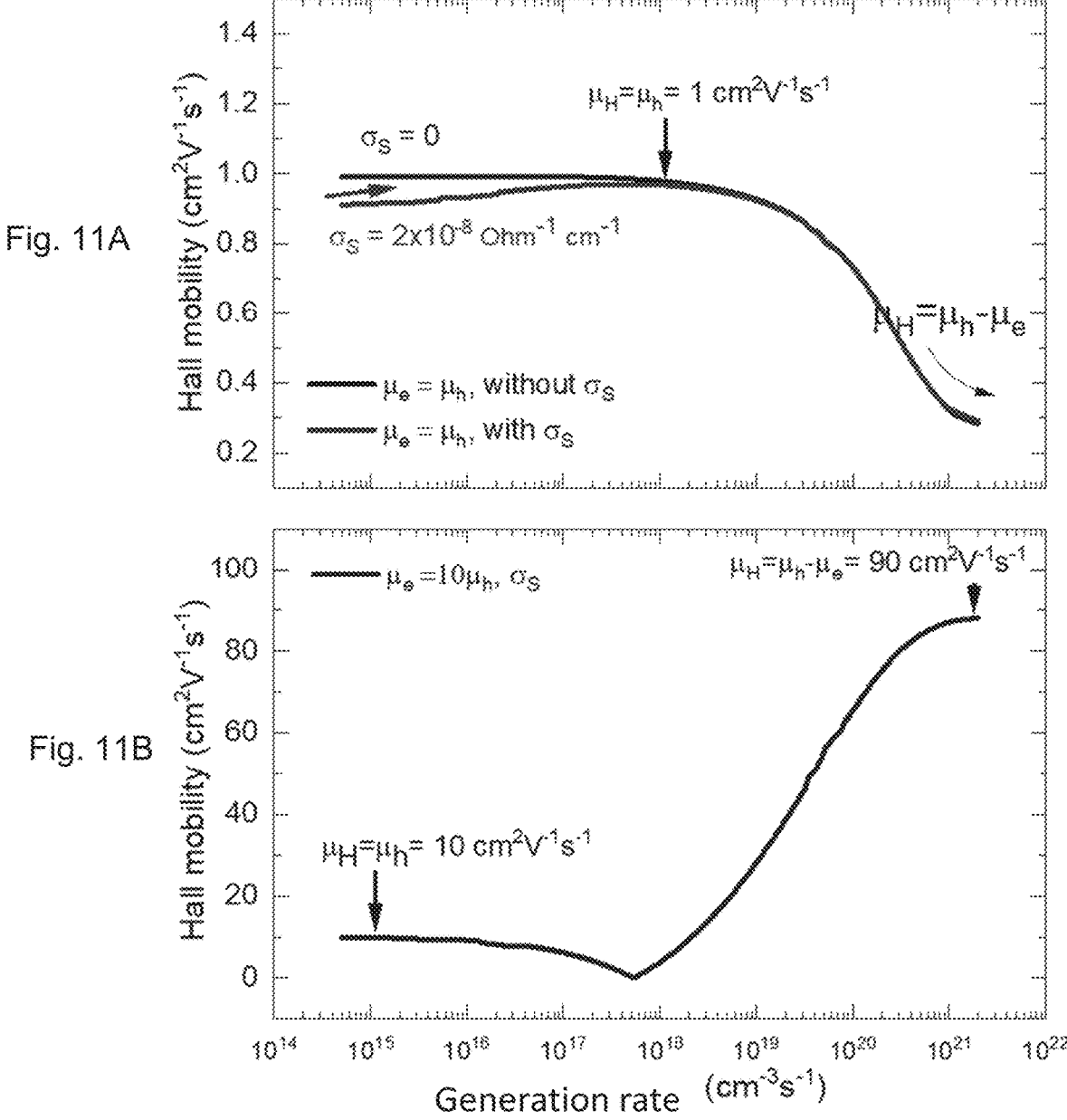
FIGS. 11A-11B show simulated Hall mobilities as a function of the generation rate for the case of identical electron and hole mobilities (FIG. 11A) with and without parasitic conductance as well as a simulated Hall mobility for different electron and hole mobilities, wherein the electron mobility is ten times the hole mobility (FIG. 11B).

FIG. 11$a$ shows simulated Hall mobilities as a function of the generation rate for the case of identical electron and hole mobilities with and without parasitic conductance. The simulations assume a semiconductor sample with $\mu_e=\mu_h=1$ $cm^2V^{-1}s^{-1}$. The difference between electron and hole lifetimes is implemented by the presence of one deep trap with a density of $10^{14}$ $cm^{-3}$, a hole capture cross-section of $2\times10^{-15}$ $cm^2$, an electron capture cross-section of $5\times10^{-15}$ $cm^2$ and an activation energy of 0.6 eV to mimic charge transport in a typical semiconductor. The charge carrier densities n and p are calculated according to a model [A. Musiienko et al., Deep Levels in high resistive CdTe and CdZnTe explored by Photo—Hall Effect and Photoluminescence Spectroscopy, Semicond. Sci. Technol. 32, 015002 (2016)].

The presence of parasitic conductivity decreases the actual value of the simulated Hall mobility at low illumination intensity. By increasing the light illumination, the simulated Hall mobility can be increased up to the value of correct free hole mobility $\mu_h=1$ $cm^2V^{-1}s^{-1}$. If the electron and hole mobilities are similar, the Hall mobility will then asymptotically decrease from the free hole mobility value so as to approach a constant value corresponding to the difference between hole and electron mobility, cf. equation 6.

FIG. 11$b$ shows a simulated Hall mobility for different electron and hole mobilities, wherein the electron mobility is ten times the hole mobility (FIG. 11$b$) with $\mu_e=100$ $cm^2V^{-1}s^{-1}$. Under these conditions, the Hall mobility increases asymptotically from the hole mobility found at low illumination towards a constant value corresponding to the difference between hole and electron mobility.

The simulations demonstrate that for any material, the Hall mobility asymptotically approaches a constant value, provided $I_2$ is large enough and the measurements comprise a sufficient signal-to-noise ratio such that the asymptotic approach is not buried in noise. Low signal-to-noise ratios typically arise due to highly doped materials, such as Perovskite. Experimentally, for Perowskite, the asymptotic approach may therefore resemble as shown in the data of FIG. 10$c$. In the Si-based sample, the asymptotic approach can be immediately seen in the data, cf. FIG. 8$c$.

LIST OF REFERENCE SIGNS

System 100
Electrical connections line 101
Cryostat 102
Hall effect insert card 103
Magnet 104
Gauss probe 106
LED holder 108
LED, Source of electromagnetic radiation 109
Sample 107
Measurement unit 200
Contact geometry card 202
AC current source 203
Lock-in amplifier 204
First current source 205
Current meter 206
Source meter 207
Second current source 208
Computer program 211
User input 213
Computer 214
Output 215
DC current source 302
Output 313
Light power meter 401
Correction algorithm 500
Correction algorithm 900
Correction algorithm 1000

BACKGROUND PATENT LITERATURE

U.S. Pat. No. 10,197,640 B2
US 2021262982 A1

I claim:

1. A method for determining respective transport properties of majority as well as minority charge carriers in a sample (107) comprising the majority and the minority charge carriers that correspond to electrons and holes or vice versa, wherein a plurality of Hall measurement trials is performed on the sample (107), wherein during each Hall measurement trial, the sample (107) is exposed to an illumination intensity I, wherein a Hall coefficient and a conductivity are acquired from each Hall measurement trial, wherein in a first Hall measurement trial, the sample (107)
is exposed to a first illumination intensity $I_1$, in the range of zero to 0.02 suns, particularly wherein the first illumination intensity is zero, and a first Hall coefficient $R_H(I_1)$ and a first conductivity $\sigma(I_1)$ are acquired, wherein from the first Hall coefficient and the first conductivity, a carrier mobility $\mu_1$ is determined, wherein in a second measurement trial, the sample (107) is exposed to a second illumination intensity $I_2$ and a second Hall coefficient $R_H(I_2)$ and, a second conductivity $\sigma(I_2)$ are acquired, wherein from the second Hall coefficient and the second conductivity, a second carrier mobility $\mu_2$ is determined, wherein the second illumination intensity $I_2$ is so high that the charge carrier density of electrons and a charge carrier density of holes in the sample (107) are identical, that the second Hall coefficient asymptotically approaches zero and that a second Hall mobility obtained from the product of the second Hall coefficient and the second conductivity asymptotically approaches a constant value, wherein a third carrier mobility $\mu_3$ is determined from the first and the second carrier mobility, particularly by subtracting the second carrier mobility from the first carrier mobility if the Hall coefficient has the same sign for the first and the second illumination intensity or by adding the second carrier mobility to the first carrier mobility if the Hall coefficient changes its sign for the first and the second illumination intensity, wherein the first carrier mobility $\mu_1$ is assigned to, particularly corresponds to a mobility of the majority charge carriers, $\mu_2$ is assigned to, particularly corresponds to the absolute value of the difference between hole and electron mobility, and the third carrier mobility $\mu_3$ is assigned to, particularly corresponds to a mobility of the minority charge carriers in the sample (107).

2. The method according to claim 1, wherein if $R_H(I_1)>0$, the majority charge carriers are holes and the minority charge carriers are electrons and wherein if $R_H(I_1)<0$, the majority charge carriers are electrons and the minority charge carriers are holes.

3. The method according to claim 1, wherein one or more intermediate Hall measurement trials are executed, wherein for each of the intermediate measurement trials the sample (107) is exposed to a different illumination intensity, wherein the illumination intensity of each intermediate measurement trial lies between the first illumination intensity $I_1$ and the second illumination intensity $I_2$, wherein an intermediate Hall coefficient, and an intermediate conductivity is determined for each intermediate measurement trial, particularly wherein the Hall coefficient $R_H$ and the conductivity $\sigma$ is determined as a function of the illumination intensities I from the plurality of Hall measurement trials.

4. The method according to claim 2, wherein a minority charge carrier density $n_3$ is determined, particularly as a function of the illumination intensity I, from the conductivity $\sigma$, a Hall coefficient $R_H$ as well as the first and the third mobility $\mu_1$, $\mu_3$, particularly from $$n_3 = \frac{\sigma(\mu_1 - R_H\sigma)}{(q(\mu_1\mu_3 + \mu_3\mu_3))}$$

if holes are the majority charge carriers and from $$n_3 = \frac{\sigma(\mu_3 + R_H\sigma)}{(q(\mu_1\mu_3 + \mu_1\mu_1))}$$

if electrons are the majority charge carriers, with q being the elementary charge.

5. The method according to claim 4, wherein a majority charge carrier density $n_1$ is determined, particularly as a function of the illumination intensity I, from the conductivity $\sigma$, the minority charge carrier density $n_3$, as well as the first and the third mobility $\mu_{1,3}$, particularly from $$n_1 = \left(\frac{\sigma}{q} - n_3\mu_3\right)/\mu_1.$$

6. The method according to claim 1, wherein at least one of the following transport properties is determined as follows, particularly as a function of the illumination intensity I:

a majority and/or a minority charge carrier lifetime $\tau_{1,3}$ based on the majority charge carrier density $n_1$ and/or the minority charge carrier density $n_3$ well as a generation rate G, particularly from $\tau_{1,3}(G)=[n_{1,3}(G)-n_{1,3}(G=0)]/G$, with the generation rate $G=I\lambda10^{-9}/hc10^3d$, and $\lambda$ the wavelength of electromagnetic radiation providing the illumination and d a thickness of the sample (107);

a majority and/or a minority charge carrier diffusion coefficient $D_{1,3}$ from the majority charge carrier mobility $\mu_1$ and/or the minority charge carrier mobility $\mu_3$ as well as a temperature T of the sample (107), particularly from $D_{1,3}=\mu_{1,3}k_BT/q$;

a majority and/or a minority charge carrier diffusion length $L_{1,3}$ based on the majority and/or the minority charge carrier lifetime $\tau_{1,3}$ as well as the majority and/or the minority charge carrier diffusion coefficient $D_{1,3}$, particularly from $L_{1,3}=\sqrt{D_{1,3}\tau_{1,3}}$;

a Quasi-Fermi level splitting $QFLS_{1,3}$ of the majority and the minority charge carriers, based on the sample (107) temperature T as well as the majority and the minority charge carrier density $n_{1,3}$, particularly from $QFLS_{1,3}=k_BT \ln(n_{1,3}/n_{int})$, a total Quasi-Fermi level splitting $QFLS_{total}$ based on the sample (107) temperature T, the majority and the minority charge carrier density $n_{1,3}$, particularly from $QFLS_{total}=k_BT \ln(n_1n_3/n_{int})$ where $n_{int}=\sqrt{n_1(I_1=0)n_3(I_1=0)}$ is an intrinsic carrier density, and an ideality factor $$\eta = \frac{q(QFLS_B - QFLS_A)}{\ln(G_B/G_A)k_bT},$$

wherein $QFLS_{B,A}$ are total Quasi Fermi level splitting determined at two different generation rates $G_{A,B}$, respectively, particularly wherein the two generation rates $G_{A,B}$ differ from each other by at least 25%.

7. The method according to claim 3, wherein, if the Hall coefficient $R_H(I)$ and the conductivity $\sigma(I)$ are altered by a parasitic conductivity $\sigma_s$, such that an acquired Hall mobility $\mu_H(I)==R_H(I)\sigma(I)$ comprises a peak value $max(\mu_H(I))$ with $max(\mu_H(I))>\mu_1(I=0)$, a corrected majority charge carrier density at the first illumination intensity, particularly at zero intensity, $n_{1,corr}(I=0)$ accounting for parasitic contributions $\sigma_s$ to the first conductivity $\sigma(I_1)$ is determined based on the first conductivity $\sigma(I_1)$ and $\mu_H(I)$, particularly from $n_{1,corr}$ $(I_1=0)=\mu_H(I_1)\sigma(I_1)/q(max(\mu_H(I)))^2$, and/or wherein a corrected first mobility $\mu_{1,corr}$ is determined based on $\mu_H(I)$, particularly from $\mu_{1,corr}=max(\mu_H(I))$.

8. The method according to claim 7, wherein the parasitic conductivity $\sigma_s$ is determined based on the first conductivity $\sigma(I_1)$, the corrected first mobility $\mu_{1,corr}$ and the corrected majority charge carrier density $n_{1,corr}(I_1)$, particularly from $\sigma_s=\sigma(I_1)-q\mu_{1,corr}n_{1,corr}(I_1)$.

9. The method according to claim 1, wherein, if the determined $\mu_1$ and $\mu_3$ differ from each other by less than 15%, and/or the acquired Hall coefficient $R_H(I)$ and the acquired conductivity $\sigma(I)$ are affected by parasitic conductivity and/or the acquired Hall coefficient $R_H(I)$ comprises a signal-to-noise ratio of less than 1, $\mu_2$ is determined based on respective Hall mobilities $\mu_H(I_C)$, $\mu_H(I_D)$ and conductivities $\sigma(I_C)$, $\sigma(I_D)$ acquired at two different illumination intensities $I_C$ and $I_D$ between $I_1$ and $I_2$, respectively, wherein $I_D$ exceeds $I_C$ by at least 25%, $$\mu_2 = \left|(\mu_H(I_D)\sigma(I_D) - \mu_H(I_C)\sigma(I_C))/(\sigma(I_D) - \sigma(I_C))\right| = |\beta|,$$

wherein $\mu_3$ is determined by adding the first and the second charge carrier mobility if $\beta<0$ and $(\mu_H(I_D)<\mu_H(I_C))$, or if $\beta>0$ and $\mu_H(I_D)>\mu_H(I_C)$ and wherein $\mu_3$ is determined by subtracting the second charge carrier mobility from the first charge carrier mobility, if $\beta>0$ and $\mu_H(I_D)<\mu_H(I_C)$.

10. The method according to claim 4, wherein, if the acquired Hall coefficient $R_H(I)$ comprises a signal-to-noise ratio of less than 1 and if the majority and the minority charge carriers are both photogenerated by the same amount, $\Delta n_1(I)=\Delta n_3(I)$, $\Delta n_1$ and $\Delta n_3$ are determined based on $\sigma$ as well as $\mu_1$ and $\mu_3$, particularly from $$\Delta n_1(I) = \Delta n_3(I) = (\sigma(I) - \sigma(I = 0))/(e(\mu_1 + \mu_3)).$$

11. The method according to claim 4, wherein, if the acquired Hall coefficient $R_H(I)$ comprises a signal-to-noise ratio of less than 1 and if only the majority charge carriers are photogenerated, such that only $n_1$ (and not $n_3$) changes as a function of the illumination intensity, $n_1$ is determined based on $\sigma(I)$ and $\mu_1$, particularly from $$n_1 = \sigma(I)/(e(\mu_1)).$$

12. The method according to claim 1, wherein the illumination is provided by means of a continuous electromagnetic wave, particularly using a light emitting diode (LED) or a laser diode (LD).

13. The method according to claim 1, wherein the sample (107) is comprised by a semiconductor device or a component of the semiconductor device, such as a solar cell, an interface, a transistor, a photodetector and/or a diode, wherein the respective transport properties of the majority as well as minority charge carriers of the sample (107) comprised by the semiconductor device are characterized.

14. A computer program comprising instructions which, when the program is executed by a computer (214), cause the computer (214) to carry out the method according to claim 1.

15. A system (100) for determining respective transport properties of majority and minority charge carriers in a sample (107) comprising the majority and the minority charge carriers that correspond to electrons and holes or vice versa, using the method according to claim 1, wherein the system comprises:

a magnet (104) configured to expose the sample (107) to a magnetic field, a current source (205) configured to apply an electrical current through the sample (107), a source of electromagnetic radiation (109) configured to expose the sample (107) to electromagnetic radiation with different illumination intensities, at least one measurement unit (200) configured to acquire a Hall coefficient and a conductivity both at a first illumination intensity $I_1$ in the range of zero to 0.02 suns, particularly at zero illumination, as well as at a second illumination intensity $I_2$ that is so high that a charge carrier density of electrons and a charge carrier density of holes in the sample (107) are identical, that the second Hall coefficient asymptotically approaches zero at the second illumination intensity $I_2$ and that a second Hall mobility obtained from the product of the second Hall coefficient and the second conductivity asymptotically approaches a constant value, and a processing unit, particularly wherein the processing unit is part of said computer (214), wherein the processing unit is configured to determine:

a first mobility $\mu_1$ acquired at the first illumination intensity as well as a second mobility $\mu_2$ acquired at the second illumination intensity, and a third mobility $\mu_3$ from the first and the second mobility, particularly by subtracting the second mobility from the first mobility, if the Hall coefficient has the same sign for the first and the second illumination intensity or by adding the second mobility with the first mobility, if the Hall coefficient changes its sign for the first and the second illumination intensity, wherein the first mobility $\mu_1$ corresponds to a mobility of the majority charge carriers $\mu_2$ corresponds to the absolute value of the difference between hole and electron mobility and the third mobility $\mu_3$ corresponds to a mobility of the minority charge carriers in the sample (107).

* * * * *